(12) United States Patent
Kim et al.

(10) Patent No.: US 12,040,040 B2
(45) Date of Patent: *Jul. 16, 2024

(54) NPU CAPABLE OF TESTING COMPONENT INCLUDING MEMORY DURING RUNTIME

(71) Applicant: DEEPX CO., LTD., Seongnam-si (KR)

(72) Inventors: Lok Won Kim, Seongnam-si (KR); Jeong Kyun Yim, Anyang-si (KR)

(73) Assignee: DEEPX CO., LTD., Seongnam-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/193,351

(22) Filed: Mar. 30, 2023

(65) Prior Publication Data

US 2023/0360720 A1 Nov. 9, 2023

Related U.S. Application Data

(63) Continuation of application No. 17/886,463, filed on Aug. 12, 2022, now Pat. No. 11,651,835.

(30) Foreign Application Priority Data

May 3, 2022 (KR) .......................... 10-2022-0054878

(51) Int. Cl.
*G11C 29/00* (2006.01)
*G05B 19/418* (2006.01)
(Continued)

(52) U.S. Cl.
CPC ........ *G11C 29/78* (2013.01); *G05B 19/41875* (2013.01); *G06F 11/26* (2013.01);
(Continued)

(58) Field of Classification Search
CPC .... G11C 29/78; G11C 29/10; G01R 31/3185; G01R 31/319; G06F 15/78; G06N 3/063
See application file for complete search history.

(56) References Cited

U.S. PATENT DOCUMENTS 6,357,020 B1 3/2002 Bohizic et al.
6,571,359 B1 5/2003 Padwekar et al.
(Continued)

FOREIGN PATENT DOCUMENTS

CN 112506690 A 3/2021
CN 114689961 A 7/2022
(Continued)

OTHER PUBLICATIONS

Lok-Won Kim et al., "Runtime Testability on Autonomous System", IEEE Transaction on Reliability, Apr. 29, 2022.

*Primary Examiner* — Ajay Ojha
(74) *Attorney, Agent, or Firm* — Bridgeway IP Law Group, PLLC; Jihun Kim

(57) ABSTRACT

A neural processing unit (NPU) for testing a component during runtime is provided. The NPU may include a plurality of functional components including a first functional component and a second functional component. At least one of the plurality of functional components may be driven for calculation of an artificial neural network. Another one of the plurality of functional components may be selected as a component under test (CUT). A scan test may be performed on the at least one functional component selected as the CUT. A tester for detecting a defect of an NPU is also provided. The tester may include a component tester configured to communicate with at least one functional component of the NPU, select the at least one functional component as a CUT, and perform a scan test for the selected CUT.

20 Claims, 29 Drawing Sheets

(51) Int. Cl.
*G06F 11/26* (2006.01)
*G11C 29/10* (2006.01)

(52) U.S. Cl.
CPC .... *G11C 29/10* (2013.01); *G05B 2219/32368* (2013.01); *G05B 2219/45031* (2013.01)

(56) References Cited

U.S. PATENT DOCUMENTS

| | | |
|---|---|---|
| 11,237,894 B1 | 2/2022 | Baum et al. |
| 11,263,077 B1 | 3/2022 | Seznayov et al. |
| 11,609,269 B2 | 3/2023 | Whetsel |
| 2003/0125908 A1 | 7/2003 | Wynn et al. |
| 2003/0196146 A1 | 10/2003 | Padwekar et al. |
| 2012/0226942 A1 | 9/2012 | Gangasani et al. |
| 2012/0233514 A1 | 9/2012 | Patil et al. |
| 2014/0096097 A1 | 4/2014 | Prasanna et al. |
| 2015/0039950 A1 | 2/2015 | Monroe et al. |
| 2015/0115994 A1 | 4/2015 | Graas et al. |
| 2017/0193154 A1 | 7/2017 | Sul |
| 2018/0357143 A1 | 12/2018 | Panambur et al. |
| 2019/0088515 A1 | 3/2019 | Jeong et al. |
| 2019/0154757 A1 | 5/2019 | Lujan et al. |
| 2021/0286693 A1 | 9/2021 | Alben et al. |
| 2022/0012164 A1 | 1/2022 | Grymel et al. |
| 2022/0100601 A1 | 3/2022 | Baum et al. |
| 2022/0101042 A1 | 3/2022 | Kaminitz et al. |
| 2022/0101043 A1 | 3/2022 | Katz et al. |
| 2022/0101887 A1 | 3/2022 | Han et al. |
| 2022/0103186 A1 | 3/2022 | Kaminitz et al. |
| 2022/0113889 A1* | 4/2022 | Park .................... G11C 29/022 |
| 2022/0171668 A1 | 6/2022 | Quigley et al. |
| 2022/0206068 A1 | 6/2022 | Kim |
| 2022/0206978 A1 | 6/2022 | Kim |
| 2023/0237320 A1* | 7/2023 | Kim ........................ G06N 3/04 |
| | | 706/15 |

FOREIGN PATENT DOCUMENTS

| | | |
|---|---|---|
| EP | 1923788 A2 | 5/2008 |
| WO | 2005/029329 A2 | 3/2005 |
| WO | 2016/191013 A1 | 12/2016 |
| WO | 2016/200718 A1 | 12/2016 |
| WO | 2017/017691 A1 | 2/2017 |

* cited by examiner

NPU CAPABLE OF TESTING COMPONENT INCLUDING MEMORY DURING RUNTIME

CROSS-REFERENCE TO RELATED APPLICATIONS

This application is a continuation of U.S. patent application Ser. No. 17/886,463 filed on Aug. 12, 2022, which claims the priority of Korean Patent Application No. 10-2022-0054878 filed on May 3, 2022, in the Korean Intellectual Property Office, the disclosure of which is incorporated herein by reference.

BACKGROUND OF THE DISCLOSURE

Technical Field

The present disclosure relates to detection of a failure of a component of a neural processing unit (NPU) in a running system, i.e., during the NPU's runtime.

Background Art

Artificial intelligence (AI) refers to intelligence which imitates human intelligence. AI technology, which has been gradually developing, is used in systems for recognition, classification, inference, prediction, control/decision making, etc. Recently, in order to increase AI operating speed, a neural processing unit (NPU) is being developed.

Meanwhile, NPUs are comprised of a multitude of internal components, which include semiconductor devices. As the density of the semiconductor devices increases, their manufacture becomes cheaper. However, increased density also increases complexity, which inherently increases a defect rate.

SUMMARY OF THE DISCLOSURE

The inventor of the present disclosure has recognized that defects arising during a manufacturing process of an NPU device may be found during a test performed before shipment from the factory. However, there may be components in which minor or minute defects are present but are not found by a pre-shipment test, such that a defective device may be handed over to users. Such defects are gradually amplified, over time, due to a fatigue stress or a physical stress caused by repeated usage, to ultimately result in an erroneous operation of the NPU.

Such erroneous operation may not be so problematic when the NPU is installed in electronics applied for user entertainment. However, the inventor of the present disclosure has recognized that the situation is different when the NPU is installed in a mission-critical product.

Specifically, the inventor of the present disclosure has recognized a problem in that when the NPU erroneously operates due to the failure, defect, or damage, unpredictable artificial intelligence (AI) operation results may be output.

For example, the inventor of the present disclosure has recognized that when the NPU is used for an electronic device mounted in an autonomous driving vehicle, a drone, Urban Air Mobility (UAM) aircraft, an unmanned aerial vehicle (UAV), or used for an electronic device mounted in an AI robot, the unpredictable AI operation results may be output due to the failure, defect, or damage of the NPU.

Therefore, the inventor of the present disclosure has recognized that it is necessary to propose a method for performing a test, heretofore performed only before factory shipment, in the NPU in the runtime.

In other words, it was recognized that it was necessary to detect defects through testing.

According to an aspect of the present disclosure, a neural processing unit (NPU) is provided. The NPU may include a plurality of functional components including at least one functional component which operates for an operation of an artificial neural network (ANN), and another functional component which is selected as a component under test (CUT) and undergoes a scan test.

The plurality of functional components may include at least one of at least one memory; at least one controller; and at least one processing element.

The plurality of the functional components may further include at least one functional component each of which includes a plurality of memory instances, the plurality of memory instances includes a first group of memory instances and a second group of memory instances. The second group of memory instances may be configured to be used if the scan test is performed on the first group of memory instances.

The CUT may include a plurality of flip-flops. The scan test may be configured to form one or more scan chains by connecting the plurality of flip-flops, apply a test input to at least one of the plurality of flip-flops, and acquire a test result from operations of combinational logics of the at least one of the plurality of flip-flops to analyze whether the CUT is defective or normal during runtime.

The NPU may further include a component tester configured to monitor each state of the plurality of functional components.

The plurality of functional components may include a first functional component and a second functional component. The first functional component may include a plurality of processing elements (PEs), the plurality of PEs including a first group of PEs and a second group of PEs. The second group of PEs may be configured to perform the operation of the artificial neural network if the scan test is performed on the first group of PEs.

According to another aspect of the present disclosure, a tester for detecting a defect of a neural processing unit (NPU) is provided. The tester may include a component tester configured to communicate with at least one functional component of the NPU, select the at least one functional component as a component under test (CUT), and perform a scan test for the selected CUT.

The component tester may be included in the NPU or disposed external to the NPU.

The tester may further include an interface configured to enable communication between the component tester and each of the at least one functional component of the NPU.

The component tester may be configured to perform the scan test on the at least one functional component during runtime of the NPU.

The tester may further include a scan wrapper arranged in correspondence to each of the at least one functional component.

The at least one functional component may further include a plurality of memory instances, the plurality of memory instances including a first group of memory instances and a second group of memory instances. The second group of memory instances may be configured to be used if the scan test is performed on the first group of memory instances.

Based on a result of the scan test, the tester may be configured to deactivate at least one of the at least one functional component of the NPU, revoke at least one address of at least one functional component of the NPU, turn off at least one of the at least one functional component of the NPU, or isolate at least one of the at least one functional component of the NPU.

The scan test may be configured to be performed with at least a portion selected from among a plurality of pre-stored test patterns.

According to another aspect of the present disclosure, a system is provided. The system may include a neural processing unit (NPU) including a plurality of functional components configured to process at least one artificial neural network (ANN) model; and a component tester configured to scan test at least one of the plurality of functional components.

The system may further include a plurality of wrappers respectively connected to the plurality of functional components.

The component tester may be configured to isolate at least one of the plurality of functional components for the scan test.

The system may further include a plurality of wrappers connected to the plurality of functional components, respectively. The component tester may be configured to monitor each of the plurality of functional components by each of the plurality of wrappers.

The component tester may be configured to perform the scan test by at least one scan chain formed by connecting a plurality of flip-flops.

The component tester may be configured to generate a control signal that controls each of the plurality of functional components to operate in a normal mode or a scan test mode.

According to the present disclosure, tests that could only be performed before shipment from a semiconductor factory can be performed in the NPU semiconductor during runtime.

According to the present disclosure, a defect may be detected based on a test result.

According to the present disclosure, even if micro defects that were not discovered before shipment from the factory are gradually amplified by fatigue stress or physical stress caused by repetitive driving, there is an advantage in detecting them.

According to the present disclosure, it is advantageous to detect that the NPU outputs unpredictable artificial intelligence (AI) operation results due to a failure, defect, or damage.

Accordingly, according to the present disclosure, a high reliability of an NPU mounted in an autonomous vehicle, drone, UAM aircraft, the UAV, or AI robot may be ensured.

DETAILED DESCRIPTION OF THE EMBODIMENT

Figure 1:
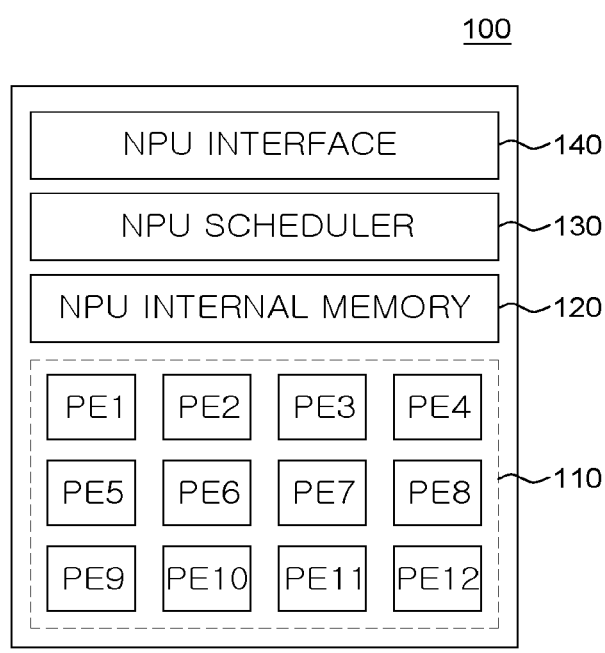
FIG. 1 is a schematic conceptual view illustrating a neural processing unit according to the present disclosure.

Specific structural or step-by-step descriptions for the embodiments according to the concept of the present disclosure disclosed in the present specification or application are merely illustrative for the purpose of describing the embodiments according to the concept of the present disclosure. The examples according to the concept of the present disclosure may be carried out in various forms and are not interpreted to be limited to the examples described in the present specification or application.

Various modifications and changes may be applied to the examples in accordance with the concept of the present disclosure and the examples may have various forms so that the examples will be described in detail in the specification or the application with reference to the drawings. However, it should be understood that the examples according to the concept of the present disclosure is not limited to the specific examples, but includes all changes, equivalents, or alternatives which are included in the spirit and technical scope of the present disclosure.

Terminologies such as first and/or second may be used to describe various components but the components are not limited by the above terminologies. The above terminologies are used to distinguish one component from the other component, for example, a first component may be referred to as a second component without departing from a scope in accordance with the concept of the present invention and similarly, a second component may be referred to as a first component.

It should be understood that, when it is described that an element is "coupled" or "connected" to another element, the element may be directly coupled or directly connected to the other element or coupled or connected to the other element through a third element. In contrast, when it is described that an element is "directly coupled" or "directly connected" to another element, it should be understood that no element is present therebetween. Other expressions which describe the relationship between components, for example, "between," "adjacent to," and "directly adjacent to" should be interpreted in the same manner.

Terminologies used in the present specification are used only to describe specific examples, and are not intended to limit the present disclosure. A singular form may include a plural form if there is no clearly opposite meaning in the context. In the present specification, it should be understood that terms "include" or "have" indicate that a feature, a number, a step, an operation, a component, a part, or a combination thereof described in the specification is present, but do not exclude a possibility of presence or addition of one or more other features, numbers, steps, operations, components, parts, or combinations thereof, in advance.

If it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning if it is not clearly defined in this specification.

When the examples is described, a technology which is well known in the technical field of the present disclosure and is not directly related to the present disclosure will not be described. The reason is that unnecessary description is omitted to clearly transmit the gist of the present disclosure without obscuring the gist.

Definition of Terminologies

Terms used in the present specification will hereinbelow be defined, in brief, to facilitate an understanding of the present disclosure.

NPU is an abbreviation for a neural processing unit and refers to a processor specialized for an operation of an artificial neural network model separately from the central processing unit (CPU).

ANN is an abbreviation for an artificial neural network and refers to a network which connects nodes in a layered structure by imitating the connection of the neurons in the human brain through a synapse to imitate human intelligence.

Information about a structure of an artificial neural network includes information about the number of layers, the number of nodes in a layer, a value of each node, information about an operation processing method, and information about a weight matrix which is applied to each node.

Information about data locality of an artificial neural network is information which predicts an operation order of an artificial neural network model which is processed by the neural processing unit based on a data access request order which is requested to a separate memory by the neural processing unit.

DNN is an abbreviation for a deep neural network and may mean that the number of hidden layers of the artificial neural network is increased to implement higher artificial intelligence.

CNN is an abbreviation for a convolutional neural network and is a neural network which functions similar to the image processing performed in a visual cortex of the human brain. The convolutional neural network is known to be appropriate for image processing and is known to be easy to extract features of input data and identify the pattern of the features.

Kernel means a weight matrix which is applied to the CNN. The value of the kernel can be determined through machine learning.

Hereinafter, the present disclosure will be described in detail by explaining examples of the present disclosure with reference to the accompanying drawings.

FIG. 1 illustrates a neural processing unit according to the present disclosure.

A neural processing unit (NPU) 100 illustrated in FIG. 1 is a processor specialized to perform an operation for an artificial neural network.

The artificial neural network refers to a network in which are collected artificial neurons which, when various inputs or entry stimulations, multiply a weight by the inputs or stimulations, add the multiplied values, and convert a value obtained by additionally adding a deviation using an active function to transmit. The artificial neural network trained as described above may be used to output an inference result from input data.

The NPU 100 may be a semiconductor device implemented by an electronic circuit. The electronic circuit may refer to a circuit including a large number of electronic elements (transistors, capacitors, etc.).

The NPU 100 may include a plurality of processing elements (PE) 110, an NPU internal memory 120, an NPU scheduler 130, and an NPU interface 140. Each of the plurality of processing elements 110, the NPU internal memory 120, the NPU scheduler 130, and the NPU interface 140 may be a semiconductor circuit to which a large number of the electronic elements are connected. Therefore, some of electronic elements may be difficult to identify or be distinguished with the naked eye, but may be identified only by an operation.

For example, an arbitrary circuit may operate as a plurality of the processing elements 110, or may operate as an NPU scheduler 130. The NPU scheduler 130 may be configured to perform the function of the control unit configured to control the artificial neural network inference operation of the NPU 100.

The NPU 100 may include the plurality of processing elements 110, the NPU internal memory 120 configured to store an artificial neural network model inferred from the plurality of processing elements 110, and the NPU scheduler 130 configured to control the plurality of processing elements 110 and the NPU internal memory 120 based on data locality information or information about a structure of the artificial neural network model. Here, the artificial neural network model may include the data locality information or the information about the structure of the artificial neural network. The artificial neural network model may refer to an AI recognition model trained to perform a specific inference function.

The plurality of processing elements 110 may perform an operation for an artificial neural network.

The NPU interface 140 may communicate with various components connected to the NPU 100, for example, memories, via a system bus.

The NPU scheduler 130 may be configured to control an operation of the plurality of processing elements 110 and read/write instructions of the NPU internal memory 120 for an inference operation of the neural processing unit 100.

The NPU scheduler 130 may control the plurality of processing elements 110 and the NPU internal memory 120 based on the data locality information or the information about the structure of the artificial neural network model.

The NPU scheduler 130 may analyze or receive analyzed information on a structure of an artificial neural network model which may operate in the plurality of processing elements 110. For example, data of the artificial neural network, which may be included in the artificial neural network model may include node data (i.e., a feature map) of each layer, data on a layout of layers, locality information of layers or information about the structure, and at least a portion of weight data (i.e., weight kernel) of each of connection networks connecting the nodes of the layers. The data of the artificial neural network may be stored in a memory provided in the NPU scheduler 130 or the NPU internal memory 120.

The NPU scheduler 130 may schedule an operation order of the artificial neural network model to be processed by an NPU 100 based on the data locality information or the information about the structure of the artificial neural network model.

The NPU scheduler 130 may acquire a memory address value in which the feature map of a layer of the artificial neural network model and weight data are stored based on the data locality information or the information about the structure of the artificial neural network model. For example, the NPU scheduler 130 may acquire the memory address value of the feature map of the layer of the artificial neural network model and the weight data which are stored in the memory. Accordingly, the NPU scheduler 130 may acquire the feature map of a layer and weight data of an artificial neural network model to be driven from the main memory, to store the acquired data in the NPU internal memory 120.

The feature map of each layer may have a corresponding memory address value.

Each of the weight data may have a corresponding memory address value.

The NPU scheduler 130 may schedule an operation order of the plurality of processing elements 110 based on the data locality information or the information about the structure of the artificial neural network model, for example, the layout information of layers of the artificial neural network or the information about the structure of the artificial neural network model.

The NPU scheduler 130 schedules based on the data locality information or the information about the structure of the artificial neural network model so that the NPU scheduler may operate in a different way from a scheduling concept of a normal CPU. The scheduling of the normal CPU operates to provide the highest efficiency in consideration of fairness, efficiency, stability, and reaction time. That is, the normal CPU schedules to perform the most processing during the same time in consideration of a priority and an operation time.

A conventional CPU uses an algorithm which schedules a task in consideration of data such as a priority or an operation processing time of each processing.

In contrast, the NPU scheduler 130 may control the NPU 100 according to a determined processing order of the NPU 100 based on the data locality information or the information about the structure of the artificial neural network model.

Moreover, the NPU scheduler 130 may operate the NPU 100 according to the determined the processing order based on the data locality information or the information about the structure of the artificial neural network model and/or data locality information or information about a structure of the NPU 100 to be used.

However, the present disclosure is not limited to the data locality information or the information about the structure of the NPU 100.

The NPU scheduler 130 may be configured to store the data locality information or the information about the structure of the artificial neural network.

That is, even though only the data locality information or the information about the structure of the artificial neural network of the artificial neural network model is utilized, the NPU scheduler 130 may determine a processing order (sequence).

Moreover, the NPU scheduler 130 may determine the processing order of the NPU 100 by considering the data locality information or the information about the structure of the artificial neural network model and data locality information or information about a structure of the NPU 100. Furthermore, optimization of the processing is possible according to the determined processing order.

The plurality of processing elements 110 refers to a configuration in which a plurality of processing elements PE1 to PE12 configured to operate a feature map and weight data of the artificial neural network is disposed. Each processing element may include a multiply and accumulate (MAC) operator and/or an arithmetic logic unit (ALU) operator, but the examples according to the present disclosure are not limited thereto.

Each processing element may be configured to optionally further include an additional special function unit for processing the additional special function.

For example, it is also possible for the processing element PE to be modified and implemented to further include a batch-normalization unit, an activation function unit, an interpolation unit, and the like.

Even though FIG. 1 illustrates a plurality of processing elements as an example, operators implemented by a plurality of multiplier and adder trees may also be configured to be disposed in parallel in one processing element, instead of the MAC. In this case, the plurality of processing elements 110 may also be referred to as at least one processing element including a plurality of operators.

The plurality of processing elements 110 is configured to include a plurality of processing elements PE1 to PE12. The plurality of processing elements PE1 to PE12 of FIG. 1 is just an example for the convenience of description and the number of the plurality of processing elements PE1 to PE12 is not limited. A size of the processing element array 110 may be determined by the number of the plurality of processing elements PE1 to PE12. The plurality of processing elements 110 may be implemented by an N×M matrix. Here, N and M are integers greater than zero. The plurality of processing elements 110 may include N×M processing elements. That is, one or more processing elements may be provided.

A size of the PE array 110 may be designed in consideration of the characteristic of the artificial neural network model in which the NPU 100 operates.

The plurality of processing elements 110 is configured to perform a function such as addition, multiplication, and accumulation required for the artificial neural network operation. In other words, the plurality of processing elements 110 may be configured to perform a multiplication and accumulation (MAC) operation.

Hereinafter, a first processing element PE1 among the plurality of processing elements 110 will be explained through an example.

Figure 2:
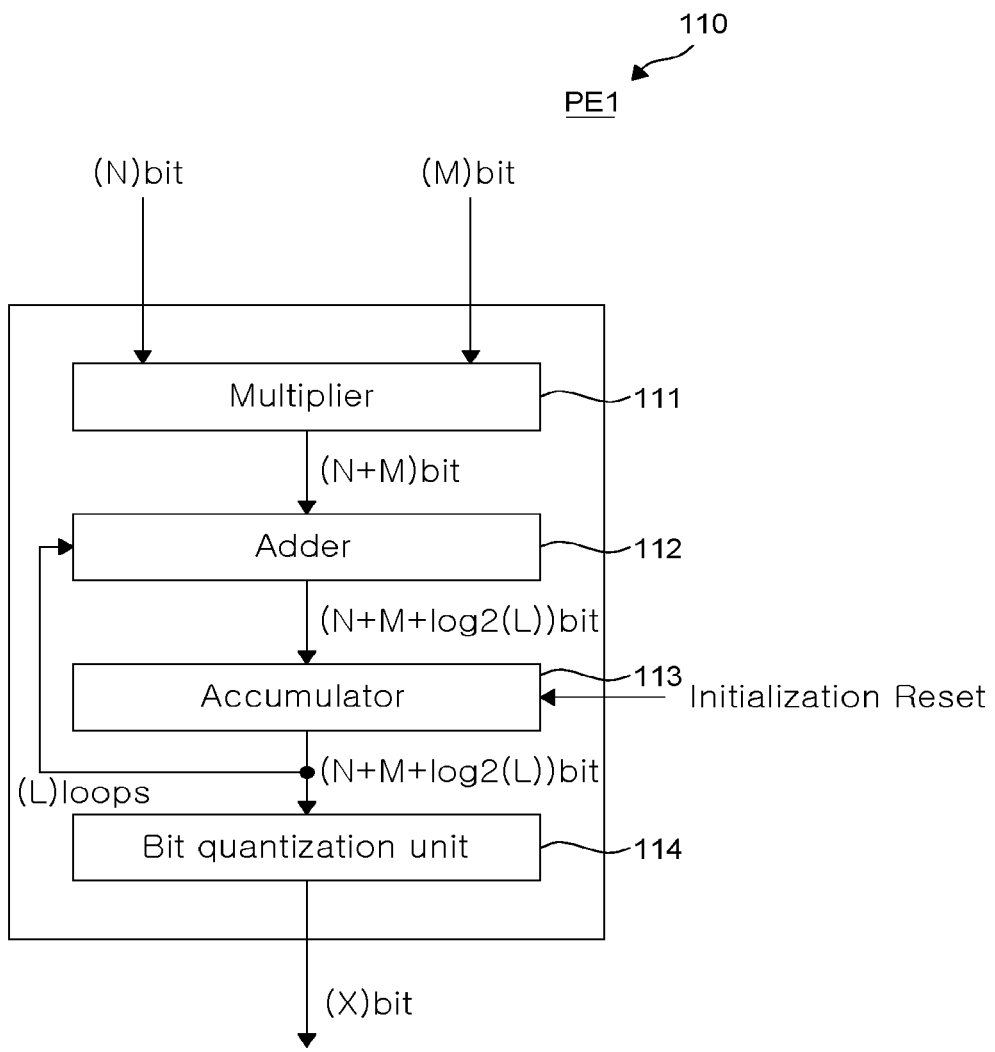
FIG. 2 is a schematic conceptual view illustrating one processing element of a plurality of processing elements applicable to the present disclosure.

FIG. 2 illustrates one processing element of a plurality of processing elements applicable to the present disclosure.

The NPU 100 according to the examples of the present disclosure may include the plurality of processing elements 110, the NPU internal memory 120 configured to store an artificial neural network model inferred from the plurality of processing elements 110, and the NPU scheduler 130 configured to control the plurality of processing elements 110 and the NPU internal memory 120 based on data locality information or information about a structure of the artificial neural network model. The plurality of processing elements 110 is configured to perform the MAC operation and the plurality of processing elements 110 is configured to quantize and output the MAC operation result, but the examples of the present disclosure are not limited thereto.

The NPU internal memory 120 may store all or a part of the artificial neural network model in accordance with the memory size and the data size of the artificial neural network model.

The first processing element PE1 may include a multiplier 111, an adder 112, an accumulator 113, and a bit quantization unit 114. However, the examples according to the present disclosure are not limited thereto and the plurality of processing elements 110 may be modified in consideration of the operation characteristic of the artificial neural network.

The multiplier 111 multiplies input (N) bit data and (M) bit data. The operation value of the multiplier 111 is output as (N+M) bit data.

The multiplier 111 may be configured to receive one variable and one constant.

The variable value may be an operation value of each layer and the NPU scheduler 130 may recognize a reusable variable value based on the data locality information or the information about the structure of the artificial neural network model and control the NPU internal memory 120 to reuse the memory.

The constant value may be weight data of each connection network and the NPU scheduler 130 may recognize a constant value of a connection network which is repeatedly used based on the data locality information or the information about the structure of the artificial neural network model and control the NPU internal memory 120 to reuse the memory.

The accumulator 113 accumulates an operation value of the multiplier 111 and an operation value of the accumulator 113 using the adder 112 as many times as the number of (L) loops. Therefore, a bit width of data of an output unit and an input unit of the accumulator 113 may be output to (N+M+log 2(L)) bits. Here, L is an integer greater than zero.

When the accumulation is completed, the accumulator 113 is applied with an initialization reset to initialize the data stored in the accumulator 113 to zero, but the examples according to the present disclosure are not limited thereto.

The bit quantization unit 114 may reduce the bit width of the data output from the accumulator 113. The bit quantization unit 114 may be controlled by the NPU scheduler 130. The bit width of the quantized data may be output to (X) bits. Here, X is an integer greater than zero. According to the above-described configuration, the plurality of processing elements 110 is configured to perform the MAC operation and the plurality of processing elements 110 may quantize the MAC operation result to output the result. The quantization may have an effect that the larger the (L) loops, the smaller the power consumption. Further, when the power consumption is reduced, the heat generation may also be reduced. Specifically, when the heat generation is reduced, the possibility of the erroneous operation of the NPU 100 due to the high temperature may be reduced.

Output data (X) bits of the bit quantization unit 114 may serve as node data of a subsequent layer or input data of a convolution. When the artificial neural network model is quantized, the bit quantization unit 114 may be configured to be supplied with quantized information from the artificial neural network model. However, it is not limited thereto and the NPU scheduler 130 may also be configured to extract quantized information by analyzing the artificial neural network model. Accordingly, the output data (X) bit is converted to a quantized bit width to be output so as to correspond to the quantized data size. The output data (X) bit of the bit quantization unit 114 may be stored in the NPU internal memory 120 with a quantized bit width.

The plurality of processing elements 110 of the NPU 100 according to an example of the present disclosure may include a multiplier 111, an adder 112, and an accumulator 113. The bit quantization unit 114 may be selected according to whether quantization is applied or not.

Figure 3:
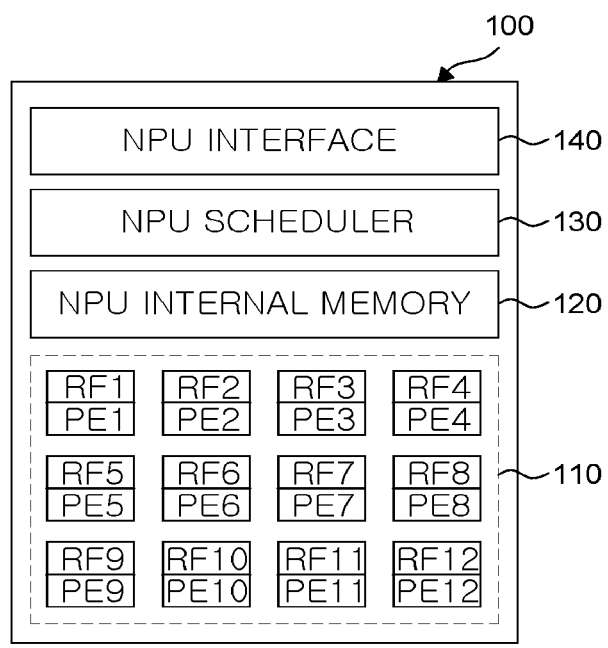
FIG. 3 is an exemplary view illustrating a modified example of the neural processing unit 100 of FIG. 1.

FIG. 3 illustrates a modified example of the NPU 100 of FIG. 1.

The NPU 100 of FIG. 3 is substantially the same as the processing unit 100 exemplarily illustrated in FIG. 1, except for the plurality of processing elements 110. Thus, redundant description will be omitted for the convenience of description.

The plurality of processing elements 110 exemplarily illustrated in FIG. 3 may further include register files RF1 to RF12 corresponding to processing elements PE1 to PE12 in addition to a plurality of processing elements PE1 to PE12.

The plurality of processing elements PE1 to PE12 and the plurality of register files RF1 to RF12 of FIG. 3 are just an example for the convenience of description and the number of the plurality of processing elements PE1 to PE12 and the plurality of register files RF1 to RF12 is not limited.

A size of, or the number of, processing element array 110 may be determined by the number of the plurality of processing elements PE1 to PE12 and the plurality of register files RF1 to RF12. The size of the plurality of processing elements 110 and the plurality of register files RF1 to RF12 may be implemented by an N×M matrix. Here, N and M are integers greater than zero.

An array size of the plurality of processing elements 110 may be designed in consideration of the characteristic of the artificial neural network model in which the NPU 100 operates. For additional explanation, the memory size of the register file may be determined in consideration of a data size, a required operating speed, and a required power consumption of the artificial neural network model to operate.

The register files RF1 to RF12 of the NPU 100 are static memory units which are directly connected to the processing elements PE1 to PE12. For example, the register files RF1 to RF12 may be configured by flip-flops and/or latches. The register files RF1 to RF12 may be configured to store the MAC operation value of the corresponding processing elements PE1 to PE12. The register files RF1 to RF12 may be configured to provide or be provided with the weight data and/or node data to or from the NPU internal memory 120.

It is also possible that the register files RF1 to RF12 are configured to perform a function of a temporary memory of the accumulator during MAC operation.

Figure 4:
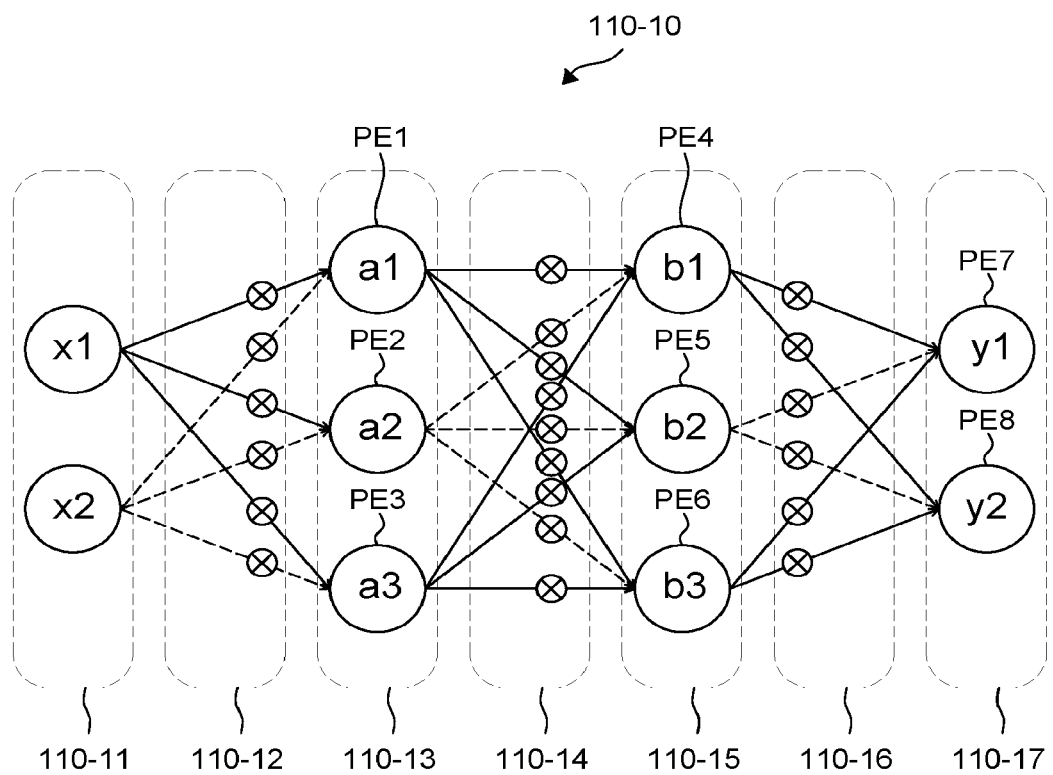
FIG. 4 is a schematic conceptual view illustrating an exemplary artificial neural network model.

FIG. 4 illustrates an exemplary artificial neural network (ANN) model.

Hereinafter, an operation of an exemplary artificial neural network model 110-10 which may operate in the NPU 100 will be explained.

The exemplary artificial neural network model 110-10 of FIG. 4 may be an artificial neural network which is trained in the NPU 100 as shown in FIG. 1 or FIG. 4 or trained in a separate machine learning device. The artificial neural network model may be an artificial neural network which is trained to perform various inference functions such as object recognition or voice recognition.

The artificial neural network model 110-10 may be a deep neural network (DNN).

However, the artificial neural network model 110-10 according to the examples of the present disclosure is not limited to the deep neural network.

For example, the artificial neural network model may be a trained model to perform inference such as object detection, object segmentation, image/video reconstruction, image/video enhancement, object tracking, event recognition, event prediction, anomaly detection, density estimation, event search, measurement, and the like.

For example, the artificial neural network model can be a model such as Bisenet, Shelfnet, Alexnet, Densenet, Efficientnet, EfficientDet, Googlenet, Mnasnet, Mobilenet, Resnet, Shufflenet, Squeezenet, VGG, Yolo, RNN, CNN, DBN, RBM, LSTM, and the like. However, the present disclosure is not limited thereto, and new artificial neural network models to operate in the NPU are being continuously released.

However, the present disclosure is not limited thereto. Further, the artificial neural network model 110-10 may be an ensemble model based on at least two different models.

The artificial neural network model 110-10 may be stored in the NPU internal memory 120 of the NPU 100.

Hereinafter, an inference process by the exemplary artificial neural network model 110-10, being performed by the NPU 100, will be described with reference to FIG. 4.

The artificial neural network model 110-10 may be an exemplary deep neural network model including an input layer 110-11, a first connection network 110-12, a first hidden layer 110-13, a second connection network 110-14, a second hidden layer 110-15, a third connection network 110-16, and an output layer 110-17. However, the present disclosure is not limited only to the artificial neural network model illustrated in FIG. 4. The first hidden layer 110-13 and the second hidden layer 110-15 may also be referred to as a plurality of hidden layers.

The input layer 110-11 may exemplarily include input nodes x1 and x2. That is, the input layer 110-11 may include information about two input values. The NPU scheduler 130 illustrated in FIG. 1 or 3 may set a memory address in which information about an input value from the input layer 110-11 is stored, in the NPU internal memory 120 of FIG. 1 or 3.

For example, the first connection network 110-12 may include information about six weight values for connecting nodes of the input layer 110-11 to nodes of the first hidden layer 110-13, respectively. The NPU scheduler 130 of FIG. 1 or 3 may set a memory address, in which information about a weight value of the first connection network 110-12 is stored, in the NPU internal memory 120. Each weight value is multiplied with the input node value, and an accumulated value of the multiplied values is stored in the first hidden layer 110-13. Here, the nodes may be referred to as a feature map.

For example, the first hidden layer 110-13 may include nodes a1, a2, and a3. That is, the first hidden layer 110-13 may include information about three node values. The NPU scheduler 130 illustrated in FIG. 1 or 3 may set a memory address for storing information about a node value of the first hidden layer 110-13, in the NPU internal memory 120.

The NPU scheduler 130 may be configured to schedule an operation order so that the first processing element PE1 performs the MAC operation of the a1 node of the first hidden layer 110-13. The NPU scheduler 130 may be configured to schedule the operation order so that the second processing element PE2 performs the MAC operation of the a2 node of the first hidden layer 110-13. The NPU scheduler 130 may be configured to schedule an operation order so that the third processing element PE3 performs the MAC operation of the a3 node of the first hidden layer 110-13. Here, the NPU scheduler 130 may pre-schedule the operation order so that the three processing elements perform each MAC operation simultaneously in parallel.

For example, the second connection network 110-14 may include information about nine weight values for connecting nodes of the first hidden layer 110-13 to nodes of the second hidden layer 110-15, respectively. The NPU scheduler 130 of FIG. 1 or 3 may set a memory address for storing, in the NPU internal memory 120, information about a weight value of the second connection network 110-14. The weight value of the second connection network 110-14 is multiplied with the node value input from the corresponding first hidden layer 110-13 and the accumulated value of the multiplied values is stored in the second hidden layer 110-15.

For example, the second hidden layer 110-15 may include nodes b1, b2, and b3. That is, the second hidden layer 110-15 may include information about three node values. The NPU scheduler 130 may set a memory address for storing information about a node value of the second hidden layer 110-15, in the NPU internal memory 120.

The NPU scheduler 130 may be configured to schedule an operation order so that the fourth processing element PE4 performs the MAC operation of the b1 node of the second hidden layer 110-15. The NPU scheduler 130 may be configured to schedule an operation order so that the fifth processing element PE5 performs the MAC operation of the b2 node of the second hidden layer 110-15. The NPU scheduler 130 may be configured to schedule an operation order so that the sixth processing element PE6 performs the MAC operation of the b3 node of the second hidden layer 110-15.

Here, the NPU scheduler 130 may pre-schedule the operation order so that the three processing elements perform each MAC operation simultaneously in parallel.

Here, the NPU scheduler 130 may determine scheduling so that the operation of the second hidden layer 110-15 is performed after the MAC operation of the first hidden layer 110-13 of the artificial neural network model.

That is, the NPU scheduler 130 may be configured to control the plurality of processing elements 100 and the NPU internal memory 120 based on the data locality information or structure information of the artificial neural network model.

For example, the third connection network 110-16 may include information about six weight values which connect nodes of the second hidden layer 110-15 and nodes of the output layer 110-17, respectively. The NPU scheduler 130 may set a memory address for storing, in the NPU internal memory 120, information about a weight value of the third connection network 110-16. The weight value of the third connection network 110-16 is multiplied with the node value input from the second hidden layer 110-15, and the accumulated value of the multiplied values is stored in the output layer 110-17.

For example, the output layer 110-17 may include nodes y1 and y2. That is, the output layer 110-17 may include information about two node values. The NPU scheduler 130 may set a memory address for storing, in the NPU internal memory 120, information about a node value of the output layer 110-17.

The NPU scheduler 130 may be configured to schedule the operation order so that the seventh processing element PE7 performs the MAC operation of the y1 node of the output layer 110-17. The NPU scheduler 130 may be configured to schedule the operation order so that the eighth processing element PE8 performs the MAC operation of the y2 node of the output layer 110-15.

Here, the NPU scheduler 130 may pre-schedule the operation order so that the two processing elements simultaneously perform the MAC operation in parallel.

Here, the NPU scheduler 130 may determine the scheduling so that the operation of the output layer 110-17 is performed after the MAC operation of the second hidden layer 110-15 of the artificial neural network model.

That is, the NPU scheduler 130 may be configured to control the plurality of processing elements 100 and the NPU internal memory 120 based on the data locality information or structure information of the artificial neural network model.

That is, the NPU scheduler 130 may analyze a structure of an artificial neural network model or receive the analyzed information which may operate in the plurality of processing elements 110. Information of the artificial neural network, which may be included in the artificial neural network model, may include information about a node value of each layer, placement data locality information of layers or information about the structure, and information about a weight value of each of connection networks connecting the nodes of the layers.

The NPU scheduler 130 is provided with data locality information or information about a structure of the exemplary artificial neural network model 110-10 so that the NPU scheduler 130 may determine an operation order from input to output of the artificial neural network model 110-10.

Accordingly, the NPU scheduler 130 may set the memory address in which the MAC operation values of each layer are stored, in the NPU internal memory 120, in consideration of the scheduling order.

That is, the NPU system memory 120 may be configured to preserve weight data of connection networks stored in the NPU system memory 120 while the inference operation of the NPU 100 is maintained. Therefore, frequency of the memory reading and writing operations may be reduced.

That is, the NPU system memory 120 may be configured to reuse the MAC operation value stored in the NPU system memory 120 while the inference operation is maintained.

Figure 5A:
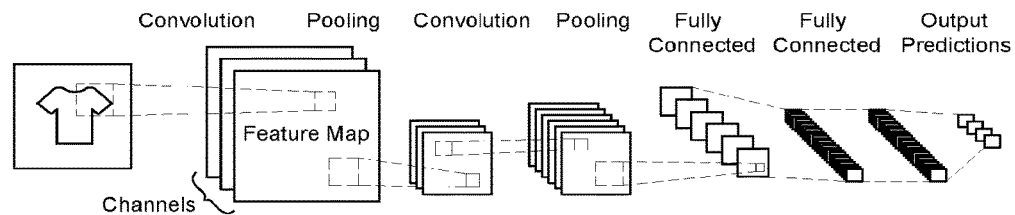
FIG. 5A is a view illustrating a basic structure of a convolution neural network.

FIG. 5A illustrates a basic structure of a convolution neural network.

Referring to FIG. 5A, a convolutional neural network may be a combination of one or a plurality of convolutional layers, a pooling layer, and a fully connected layer.

In the example of the present disclosure, in the convolutional neural network, there is a kernel for extracting features of an input image of a channel for each channel. The kernel may be composed of a two-dimensional matrix, and convolution operation is performed while traversing input data. The size of the kernel may be arbitrarily determined, and the stride at which the kernel traverses input data may also be arbitrarily determined. A result of convolution of all input data per kernel may be referred to as a feature map or an activation map. Hereinafter, the kernel may include a set of weight values or a plurality of sets of weight values. The number of kernels for each layer may be referred to as the number of channels.

As such, since the convolution operation is an operation formed by combining input data and a kernel, an activation function for adding non-linearity may be applied thereafter. When an activation function is applied to a feature map that is a result of a convolution operation, it may be referred to as an activation map.

Specifically, referring to FIG. 5A, the convolutional neural network includes at least one convolutional layer, at least one pooling layer, and at least one fully connected layer.

For example, convolution can be defined by two main parameters: the size of the input data (typically a 1×1, 3×3, or 5×5 matrix) and the depth of the output feature map (the number of kernels). These key parameters can be computed by convolution. These convolutions may start at depth 32, continue to depth 64, and end at depth 128 or 256. The convolution operation may mean an operation of sliding a kernel of size 3×3 or 5×5 over an input image matrix that is input data, multiplying each weight of the kernel and each element of the input image matrix that overlaps, and then adding them all.

An activation function may be applied to the output feature map generated in this way to finally output an activation map. In addition, the weight used in the current layer may be transmitted to the next layer through convolution. The pooling layer may perform a pooling operation to reduce the size of the feature map by down-sampling the output data (i.e., the activation map). For example, the pooling operation may include, but is not limited to, max pooling and/or average pooling.

The maximum pooling operation uses the kernel, and outputs the maximum value in the area of the feature map overlapping the kernel by sliding the feature map and the kernel. The average pooling operation outputs an average value within the area of the feature map overlapping the kernel by sliding the feature map and the kernel. As such, since the size of the feature map is reduced by the pooling operation, the number of weights of the feature map is also reduced.

The fully connected layer may classify data output through the pooling layer into a plurality of classes (i.e., inferenced values), and output the classified class and a score thereof. Data output through the pooling layer forms a three-dimensional feature map, and this three-dimensional feature map can be converted into a one-dimensional vector and input as a fully connected layer.

Figure 5B:
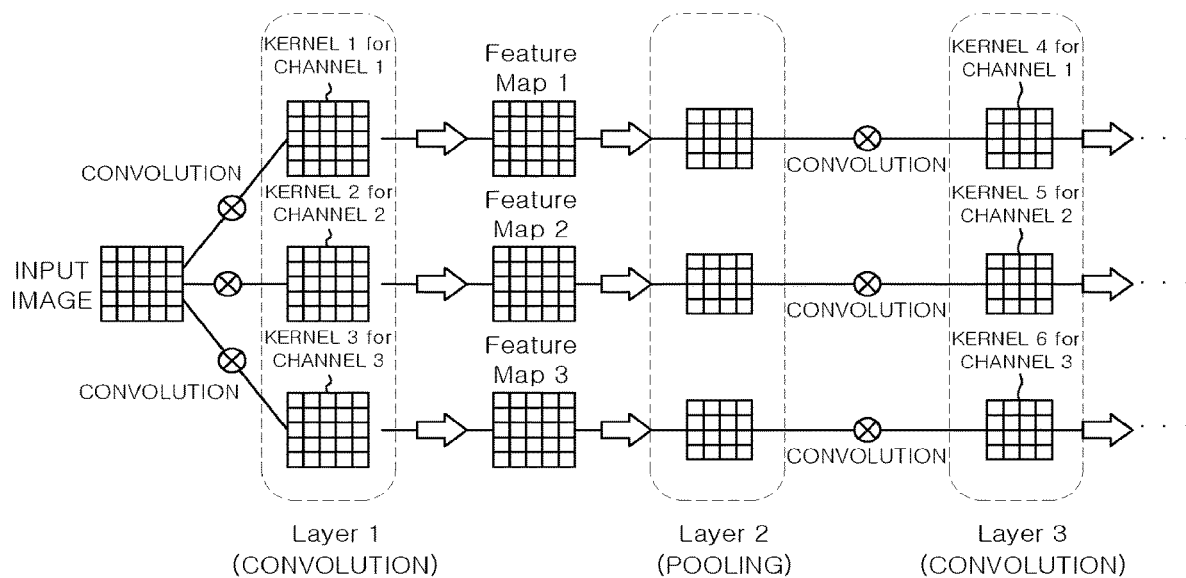
FIG. 5B is a view illustrating an overall operation of a convolution neural network.

FIG. 5B illustrates an overall operation of a convolution neural network.

Referring to FIG. 5B, the input image is a two-dimensional matrix that is 5×5 in size. Further, in FIG. 5B, three nodes, that is, a channel 1, a channel 2, and a channel 3, are used.

First, a convolution operation of the layer 1 will be described.

The input image is convoluted with a kernel 1 for a channel 1 at a first node of the layer 1, and a feature map 1 is output as a result. Further, the input image is convoluted with a kernel 2 for a channel 2 at a second node of the layer 1, and a feature map 2 is output as a result. The input image is convoluted with a kernel 3 for a channel 3 at a third node, and a feature map 3 is output as a result.

Next, a pooling operation of the layer 2 will be described.

The feature map 1, the feature map 2, and the feature map 3 output from the layer 1 are input to three nodes of the layer 2. Layer 2 receives feature maps output from the layer 1 as inputs to perform the pooling. The pooling may reduce a size or emphasize a specific value in the matrix. The pooling method may include max pooling, average pooling, and minimum pooling. The max pooling is used to collect maximum values in a specific area of the matrix, and the average pooling is used to calculate an average in a specific area.

In order to process each convolution, the processing elements PE1 to PE12 of the NPU 100 are configured to perform a MAC operation.

In the example of FIG. 5B, a feature map of a 5×5 matrix is reduced to a 4×4 matrix by the pooling.

Specifically, the first node of the layer 2 performs the pooling with the feature map 1 for the channel 1 as an input, and then outputs a 4×4 matrix. The second node of the layer 2 performs the pooling with the feature map 2 for the channel 2 as an input, and then outputs a 4×4 matrix. The third node of the layer 2 performs the pooling with the feature map 3 for the channel 3 as an input, and then outputs a 4×4 matrix.

Next, a convolution operation of the layer 3 will be described.

A first node of the layer 3 receives the output from the first node of the layer 2 as an input to perform the convolution with a kernel 4 and output a result thereof. A second node of the layer 3 receives the output from the second node of the layer 2 as an input to perform the convolution with a kernel 5 for the channel 2 and outputs a result thereof. Similarly, a third node of the layer 3 receives the output from the third node of the layer 2 as an input to perform the convolution with a kernel 6 for the channel 3 and outputs a result thereof.

As described above, the convolution and the pooling are repeated and finally, as illustrated in FIG. 5A, a fully connected layer may be output. The output may be input to the artificial neural network for image recognition again.

Hereinafter, an NPU semiconductor will be mainly explained, but the disclosure of the present specification is not limited thereto and the present disclosure is also applicable to a system in package (SiP) or a printed circuit board (PCB)-based board level system. For example, each functional component is implemented by an independent semiconductor chip and is connected by a system bus which is implemented by an electrically conductive pattern formed on the PCB.

Figure 6A:
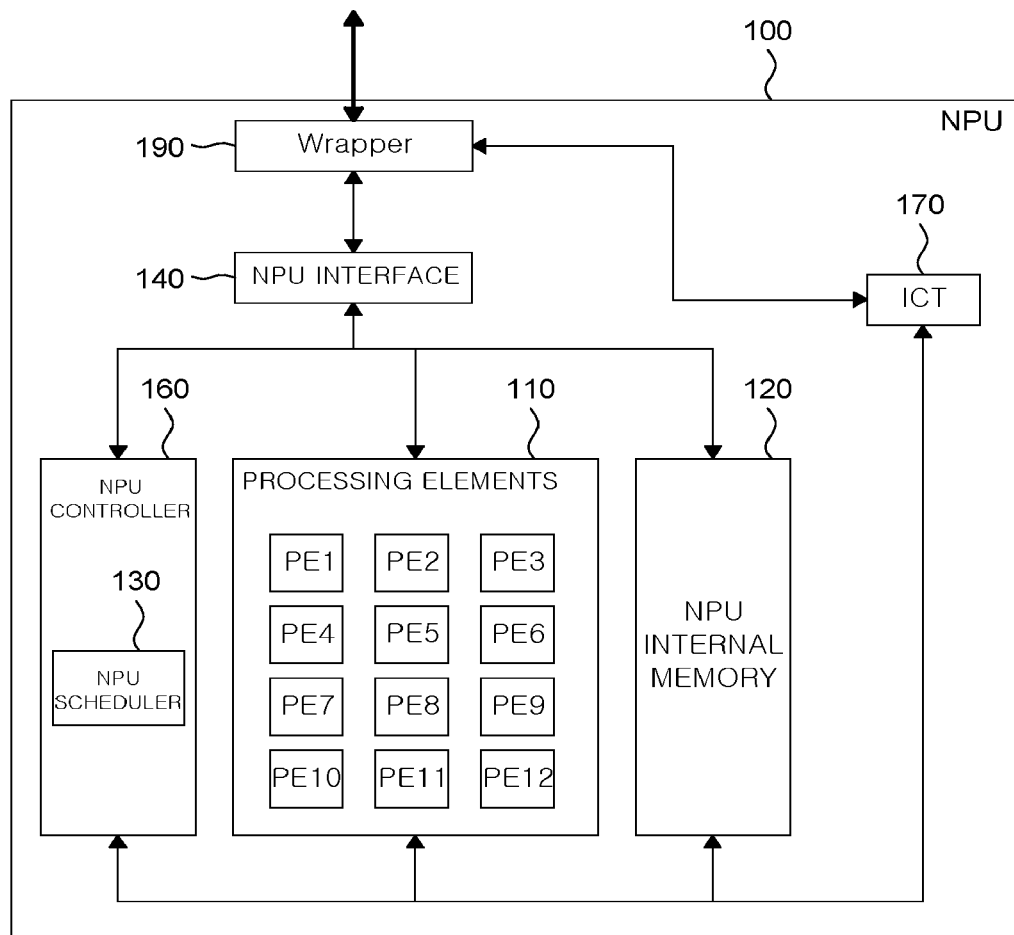
FIG. 6A is a block diagram illustrating the configuration of an NPU with a test function according to a first example of the present disclosure.

FIG. 6A shows an NPU having a test function according to a first example.

Referring to FIG. 6A, the exemplary NPU 100 may include a plurality of functional components, an In-system Component Tester (ICT) 170, and at least one wrapper 190.

A wrapper can adapt the interfaces of components that communicate with each other. Accordingly, the wrapper may also be referred to as an interface circuit.

The plurality of functional components may include a processing element (PE) array 110, an internal memory 120, a controller 160, and an interface 140.

The interface 140 may be referred to as a bus interface unit (BIU).

The controller 160 may include a scheduler 130.

The examples of the present disclosure are not limited thereto, and at least some of the plurality of functional components may be removed. The examples of the present disclosure are not limited thereto and may further include other functional components other than the plurality of functional components described above.

The plurality of processing elements 110 may be connected to the controller 160 directly or through an interface 140. Similarly, the memory 120 may be connected to the controller 160 directly or through the interface 140. The interface 140 is monitored by the wrapper 190. Specifically, the wrapper 190 may monitor that the controller 160 controls the plurality of processing elements 110 through the interface 140. Also, the wrapper 190 may monitor that the controller 160 controls the memory 120 through the interface 140.

The ICT 170 may be connected to the controller 160 through a dedicated signal channel. Also, the ICT 170 may be connected to the wrapper 190 through a dedicated signal channel.

The wrapper 190 may be connected to the ICT 170 through a dedicated signal channel. Also, the wrapper 190 may be coupled to the interface 140 through a dedicated signal channel. Also, the wrapper 190 may be connected to each functional component through the interface 140.

The ICT 170 may directly monitor the controller 160 or monitor the states of the plurality of functional components through the wrapper 190. Each functional component may be in an idle state or a busy state.

When an idle functional component is found, the ICT 170 may select the corresponding functional component as a component under test (CUT). In addition, depending on the circumstance, the ICT 170 may also select a functional component that is not in an idle state as the CUT.

When an idle functional component is found, the ICT 170 may select the corresponding functional component as a component under test (CUT).

If a plurality of functional components are in an idle state, the ICT 170 may select any one functional component as the CUT according to a preset rule. As an alternative to application of the preset rule, the ICT 170 may randomly select, among the idle state functional components, any one functional component as a CUT.

According to a CUT selection as above, the ICT 170 may cut off the connection between the functional component selected as the CUT and the interface 140, or ICT 170 may isolate the selected functional component from the interface 140. To this end, the ICT 170 may instruct the wrapper 190 to cut off or isolate the functional component from the interface 140. To be more specific, the ICT 170 cuts off the connection between the functional component selected as the CUT and the interface 140 by means of the wrapper 190 and then may instruct the wrapper 190 to transmit a signal to the interface 140, instead of the functional component selected as the CUT.

At this time, the signal which is transmitted to the interface 140 may be a signal which is transmitted to the interface 140 when the functional component selected as the CUT is in an idle state. To this end, when the functional component selected as the CUT is in an idle state, the wrapper 190 may monitor (or overhear) and store the signal which is transmitted to the interface 140. The corresponding wrapper 190 regenerates the stored signal to transmit the regenerated signal to the interface 140. In the meantime, the corresponding wrapper 190 may detect a signal from the interface 140.

Thereafter, the ICT 170 may test the functional component selected as the CUT.

The above-mentioned preset rule may include one or more of a priority rule according to the mission to be performed, a rule for priority between functional components, a rule according to the presence or absence of a spare for the corresponding functional component, a rule defined by the number of tests, and a rule defined by a previous test result.

When a collision or conflict occurs due to access from the interface 140 to a functional component selected as the CUT at the time of starting the test or during the test, the ICT 170 may detect the collision.

If so, the ICT 170 may stop (interrupt) the test and drive a back-off timer with respect to the collision or conflict.

The ICT 170 may reinstate the connection of the functional component selected as the CUT to the interface 140.

In the meantime, when the back-off time of the back-off timer for the collision or conflict expires, the ICT 170 may monitor whether the functional components enter an idle state again. If the functional component enters the idle state again, the ICT 170 may select the functional component as a CUT again.

If no collision or conflict is detected, the ICT 170 may continue the test and, when the test is completed, analyze the test result.

The test may be for verifying whether a component of the system is defective in its manufacture, has been compromised, or has broken down. The compromising or the breakdown may be caused by a fatigue stress due to repeated usage or a physical stress such as heat or electromagnetic pulse (EMP). That is, it may be configured to detect a defect based on the test result.

The test is performed on the plurality of processing elements 110 will be described below. The test may be one of two types, namely, a function test and a scan test.

When the function test is performed on the plurality of processing elements 110, the ICT 170 may input a predetermined ANN test model and a test input to the plurality of processing elements 110. When the plurality of processing elements 110 outputs an inference result for the test input using the input ANN test model, the ICT 170 compares an intended inference result and the inference result from the plurality of processing elements 110 to analyze whether the plurality of processing elements 110 is normal or defective. For example, when the ANN test model is a predetermined CNN and the test input is a simple test image, the plurality of processing elements 110 performs the convolution and the pooling on the test image using the ANN test model to output a fully connected layer.

When the scan test is performed on the plurality of processing elements 110, as it will be described below, the ICT 170 may thread the flip-flops in the plurality of processing elements 110 with a scan chain. The ICT 170 may inject the test input to at least one flip-flop and may acquire a test result from an operation of a combinational logic of the flip-flop to analyze whether the plurality of processing elements 110 is defective or normal during the runtime.

The test performed by the ICT 170 may be a test performed to determine a fair quality before shipment of an NPU semiconductor which is mass-produced in a factory.

According to the present disclosure, it is noted that the test for determining a fair quality may also be performed during the runtime of the NPU.

That is, according to a known art, a test for determining a fair quality is possible before the NPU semiconductor ships from the factory.

However, according to the present disclosure, functional components in the idle state are found from a plurality of functional components in the NPU to be sequentially tested so that the fair quality test may be performed on the NPU in the runtime.

As a test analysis result, when the corresponding functional component is determined as normal, the ICT 170 returns the connection with the functional component to the interface 140. That is, the ICT 170 may allow the connection between the functional component and the interface 140. To be more specific, the ICT 170 may initialize the functional component to be connected to the interface 140 and then instruct the wrapper 190 to stop a signal which is transmitted to the interface 140.

However, if the test analysis result determines the corresponding functional component as defective, the ICT 170 may repeat the test several times.

When as a result of several times repeated tests, the functional component is determined as defective. That is, when it is determined that the functional component in the NPU is defective in its manufacture, has been compromised, or has broken down, the ICT 170 may deactivate the functional component.

As an alternative, when an error code included in a one-time test analysis result indicates that the functional component in the NPU is defective in its manufacture, has been compromised, or has broken down, the ICT 170 may deactivate the functional component.

In order to deactivate the functional component, the ICT 170 may cut-off or disconnect the connection of the functional component determined as defective to isolate the functional component determined as defective from the interface 140. Alternatively, in order to deactivate the defective functional component, the ICT 170 may power off (turn off) the functional component. When the functional component is powered off, the erroneous operation of the defective functional component is prevented and the power consumption may be reduced.

Further, in order to deactivate the defective functional component, the ICT 170 may revoke the address of the functional component on the interface 140 or transmit a signal for deleting it to the interface 140. That is, the ICT 170 may transmit a signal for deleting an address of the defective functional component to a component having addresses used on the interface 140.

In the meantime, when the deactivation is completed, the ICT 170 may determine whether there is a spare for the functional component.

That is, various examples of the present disclosure may be configured to include at least one spare component corresponding to at least one functional component.

That is, various examples of the present disclosure may be configured to include each spare component corresponding to each of a plurality of functional components.

Even though a spare may exist, when the spare is not in an active state, the ICT 170 may activate the spare. That is, the ICT 170 may transmit a signal including a request for updating an address of the activated spare in a table to a component having the table of addresses used on the interface 140.

When an address on the interface 140 is not allocated to the spare in the deactivated state, the ICT 170 may transmit a signal for reallocating an address of the defective functional component to the spare to the interface 140.

After monitoring whether the spare is in an idle state, the ICT 170 may perform the test.

In FIG. 6A, the ICT 170 is shown to be included in the NPU 100, but may be disposed outside the NPU 100 as will be described later. This will be described with reference to FIG. 6B.

Figure 6B:
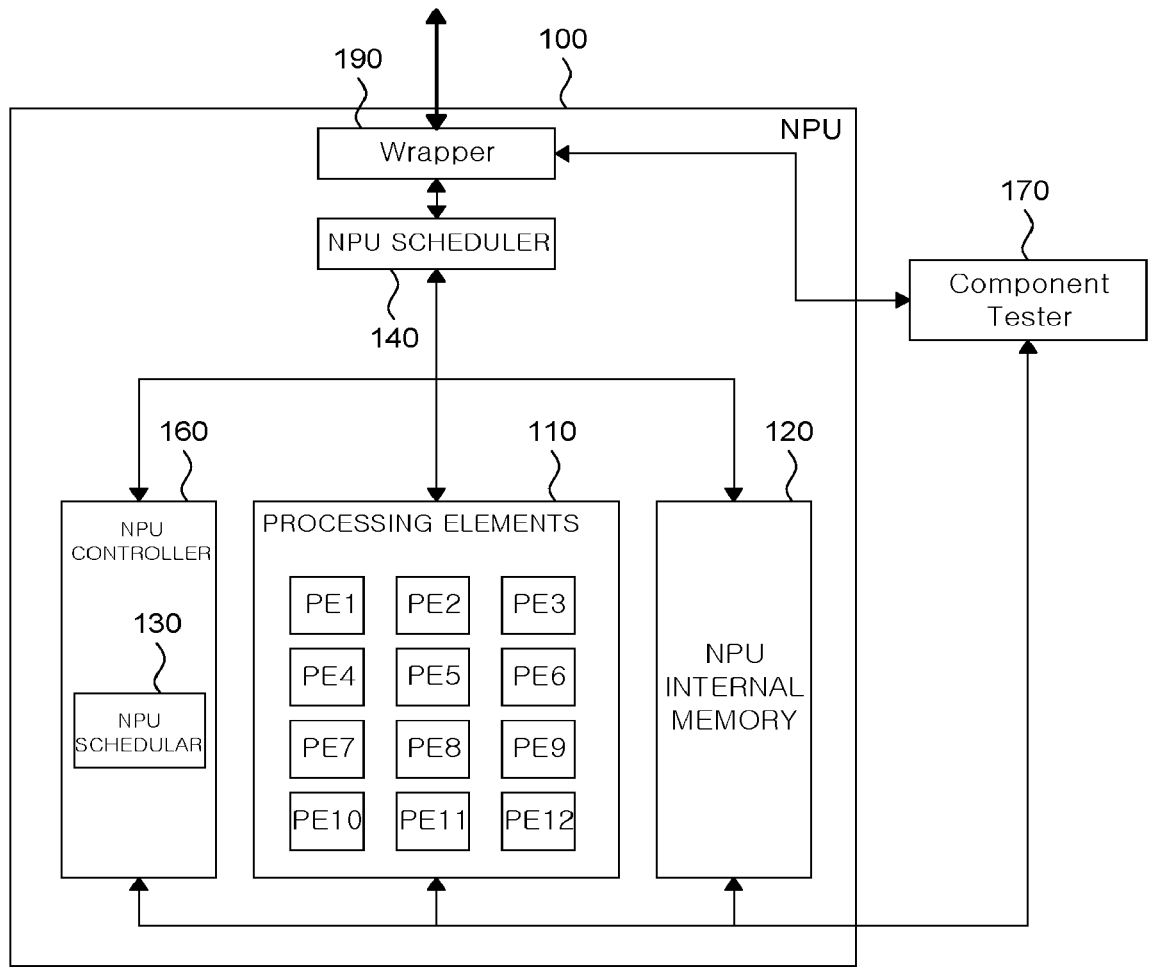
FIG. 6B is an exemplary diagram illustrating a modified example of the first example shown in FIG. 6A.

FIG. 6B illustrates a modified example of the first example shown in FIG. 6A.

As shown in FIG. 6B, the component tester 170 may be located outside the NPU 100. In this case, the component tester 170 may be called an out-system component tester (OCT) rather than an ICT. The component tester 170 illustrated in FIG. 6B may select at least one of a plurality of functional components as a CUT through the wrapper 190 to perform a test. Depending on the situation, the component tester 170 may select a functional component that is not in an idle state as a CUT to perform the test.

Figure 6C:
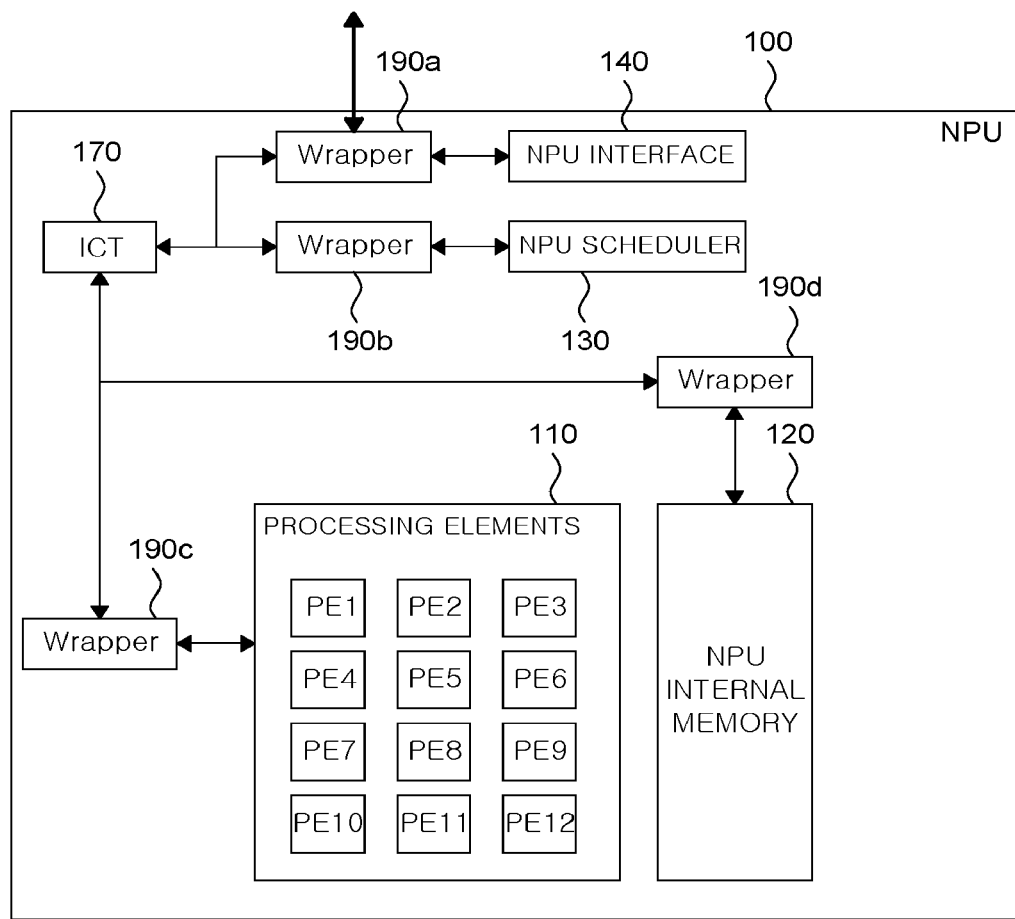
FIG. 6C is a block diagram illustrating the configuration of an NPU with a test function according to a second example of the present disclosure.

FIG. 6C shows an NPU having a test function according to a second example.

Referring to FIG. 6C, the exemplary NPU 100 may include a plurality of functional components, an in-system component tester (ICT) 170, and a plurality of wrappers 190*a*, 190*b*, 190*c*, 190*d*. The plurality of wrappers may be collectively referred to as wrappers 190.

The wrappers 190 may adapt the interfaces of components that communicate with each other. Accordingly, a wrapper may also be referred to as an interface circuit.

The plurality of functional components may include a plurality of processing elements (or PE array) 110, a memory 120, a scheduler 130, and an NPU interface 140.

The interface 140 may be referred to as a bus interface unit (BIU). The interface 140 may be in charge of communication with a semiconductor device disposed outside the NPU, for example, a main memory or a central processing unit (CPU).

The plurality of processing elements 110 may be connected to the scheduler 130 through the wrapper 190*c*, the ICT 170, and the wrapper 190*b*. Similarly, the memory 120 may be connected to the scheduler 130 through the wrapper 190*d*, the ICT 170, and the wrapper 190*b*.

The ICT 170 may monitor and control each functional component through a plurality of wrappers 190. For example, the ICT 170 may monitor and control the access of the NPU scheduler 130 to the plurality of processing elements 110 through the wrapper 190*b* and the wrapper 190*c*. In addition, the ICT 170 may monitor and control access to the memory 120 by the NPU scheduler 130 through the wrapper 190*b* and the wrapper 190*d*. Similarly, the ICT 170 may monitor and control access of the plurality of processing elements 110 to the memory 120 through the wrapper 190*c* and the wrapper 190*d*.

The ICT 170 may be connected to each wrapper 190 through a dedicated signal channel.

The ICT 170 monitors the plurality of processing elements 110 through the wrapper 190*c*, monitors the memory 120 through the wrapper 190*d*, or the scheduler 130 through the wrapper 190*b*. By monitoring, it is possible to monitor whether each of the plurality of processing elements 110, the memory 120, and the scheduler 130 is in an idle state or a busy state.

When an idle functional component is found, the ICT 170 may select the corresponding functional component as a component under test (CUT).

If a plurality of functional components are in an idle state, the ICT 170 may select any one functional component as the CUT according to a preset rule.

If a plurality of functional components are in an idle state, the ICT 170 may randomly select any one functional component as the CUT. Then, the ICT 170 may block or isolate the connection of the functional component selected as the CUT. To this end, the ICT 170 may instruct the wrapper 190 to block or isolate the corresponding functional component.

More specifically, after the ICT 170 may block the connection with the functional component selected as the CUT through the wrapper 190, the wrapper 190 instructs the corresponding wrapper 190 to imitate and transmit a necessary signal on behalf of the functional component selected as the CUT. In this case, the transmitted signal may be a signal transmitted when the functional component selected as the CUT is in an idle state. To this end, the wrapper 190 may monitor (or overhear) and store a transmitted signal when the functional component selected as the CUT is in the idle state. Then, the wrapper 190 may regenerate the stored signal and transmit it.

Thereafter, the ICT 170 may perform a test on the functional component selected as the CUT. This is similar to the description provided with reference to FIG. 6A, and thus redundant descriptions will be omitted.

When a collision occurs due to access to the functional component selected as the CUT at the time of starting the test or during the test, the ICT 170 may detect the collision.

Then, the ICT 170 may stop the test and drive a back-off timer for the collision.

Then, the ICT 170 may return the functional component selected to the CUT.

Meanwhile, when the back-off timer for the collision expires, the ICT 170 may monitor whether the corresponding functional component enters the idle state again. If the corresponding functional component enters the idle state again, the ICT 170 may select the corresponding functional component as the CUT again.

If the collision is not detected, the ICT 170 may continue the test and, when the test is completed, analyze the test result.

Since other descriptions are similar to those provided with reference to FIG. 6A, redundant descriptions will not be repeated. Instead, the description provided with reference to FIG. 6A will be cited.

In FIG. 6C, the ICT 170 is shown to be included in the NPU 100, but may be disposed outside the NPU 100 as will be described later. This will be described with reference to FIG. 6D.

Figure 6D:
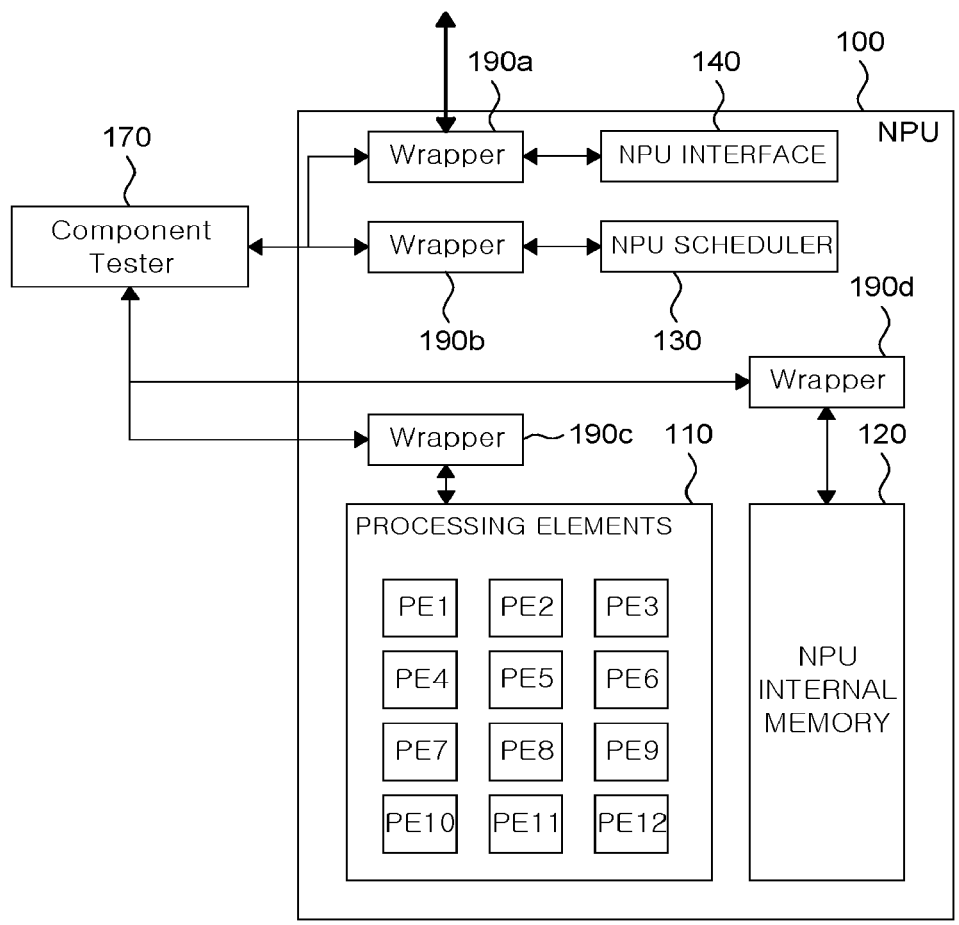
FIG. 6D is an exemplary view illustrating a modified example of the second example shown in FIG. 6C.

FIG. 6D illustrates a modified example of the second example shown in FIG. 6C.

As shown in FIG. 6D, the component tester 170 may be located outside the NPU 100. In this case, the component tester 170 may be called an out-system component tester (OCT) rather than an ICT. The component tester 170 illustrated in FIG. 6D may select at least one of a plurality of functional components as a CUT through the wrapper 190 to perform a test. Depending on the situation, the component tester 170 may select a functional component that is not in an idle state as a CUT to perform a test.

Figure 7:
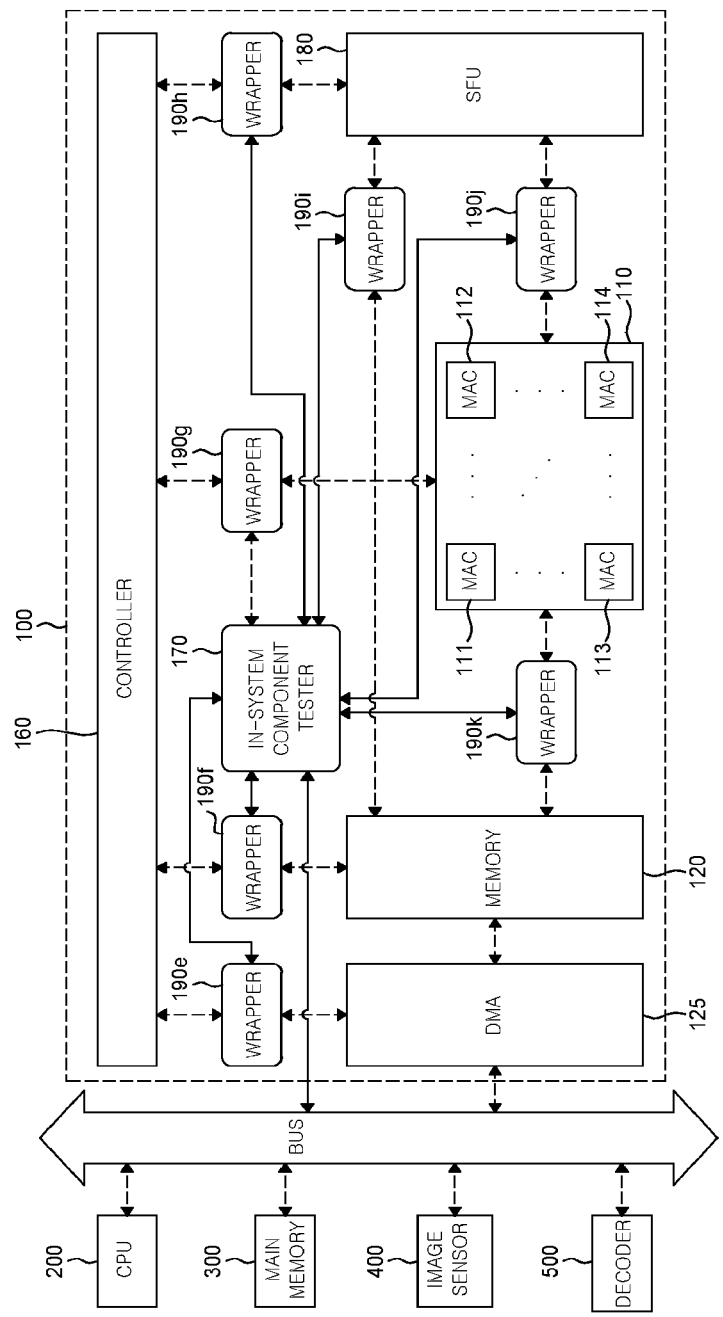
FIG. 7 is a block diagram illustrating the configuration of an NPU with a test function according to a third example of the present disclosure.

FIG. 7 shows an NPU with a test function according to a third example.

Referring to FIG. 7, the exemplary NPU 100 may be connected to a central processing unit (CPU) 200 and a main memory 300 through a system bus. Additionally, the NPU 100 may be connected to an image sensor 400 through a system bus. Additionally, the NPU 100 may be connected to a decoder 500 through a system bus.

The exemplary NPU 100 shown in FIG. 7 includes a plurality of functional components, an in-system component tester (ICT) 170, and a plurality of wrappers 190e, 190f, 190g, 190h, 190i, 190j, 190k. The plurality of wrappers may be collectively referred to as wrappers 190.

The plurality of functional components may include a plurality of processing elements (or PE array) 110, an internal memory 120, a direct memory access (DMA) 125, a controller 160, and a special function unit (SFU) 180.

The controller 160 may include a scheduler 130 as shown in FIG. 6A. In addition, the controller 160 may also include the interface 140 shown in FIG. 6B. That is, the controller 160 may include both the scheduler 130 and the interface 140. The operation of the scheduler 130 and the interface 140 are described above.

The DMA 125 controls access to the memory 120. To this end, the DMA 125 may manage a physical address of the memory 120.

The plurality of processing elements 110 may include a plurality of PEs 111, 112, 113, and 114. Each PE may include a multiply-accumulate (MAC) operator.

A wrapper may be disposed between each functional component and the controller 160. For example, the wrapper 190e may be disposed between the DMA 125 and the controller 160. The wrapper 190f may be disposed between the memory 120 and the controller 160. The wrapper 190g may be disposed between the plurality of processing elements 110 and the controller 160. The wrapper 190h may be disposed between the SFU 180 and the controller 160. The wrapper 190i may be disposed between the SFU 180 and the memory 120. The wrapper 190j may be disposed between the plurality of processing elements 110 and the SFU 180. The wrapper 190k may be disposed between the plurality of processing elements 110 and the memory 120.

The ICT 170 may monitor and control each functional component through the plurality of wrappers 190. For example, the ICT 170 may monitor and control the interaction between the plurality of processing element 110 and the memory 120 through the wrapper 190k. Also, the ICT 170 may monitor and control the memory 120 through the wrapper 190f. Also, the ICT 170 may monitor and control the DMA 125 through the wrapper 190e. Also, the ICT 170 may monitor and control the interaction between the controller 160 and the plurality of processing elements 110 through the wrapper 190g. The ICT 170 may monitor and control the SFU 180 through the wrapper 190i. In addition, the ICT 170 may monitor and control the interaction between the controller 160 and the SFU 180 through the wrapper 190h.

The ICT 170 may be connected to each wrapper 190 through a dedicated signal channel.

The ICT 170 may monitor whether a corresponding functional component is in an idle state or a busy state through each wrapper.

When an idle functional component is found, the ICT 170 may select the corresponding functional component as a component under test (CUT).

If the plurality of functional components are in the idle state, as described above, the ICT 170 may select any one functional component as the CUT according to a preset rule. And as described above, the ICT 170 may block or isolate the connection of the functional component selected as the CUT.

Thereafter, the ICT 170 may perform a test on the functional component selected as the CUT. This is similar to the description provided with reference to FIG. 6A, and thus will not be repeated.

If no collision is detected, as described above, the ICT 170 continues the test, and when the test is completed, the ICT 170 may analyze the test result.

As described above, if it is determined that the test analysis result is abnormal, the ICT 170 may repeat the test several more times.

As a result of repeating the test several times, if it is determined that the corresponding functional component is abnormal, that is, if it is determined that the corresponding functional component is incorrectly manufactured, damaged, or broken in the NPU, the ICT 170 can deactivate the corresponding functional component.

When there is no spare for the deactivated functional component, the ICT 170 may allow the SFU 180 to be programmed to imitate the same operation as the deactivated functional component. To this end, the SFU 180 may be implemented as a field programmable gate array (FPGA). Information for programming the SFU 180 may be stored in the internal memory 120. Alternatively, the information for programming the SFU 180 may be stored in a cache memory of the SFU 180.

As described above, when the SFU 180 is programmed to imitate the same operation as the deactivated functional component, the ICT 170 may transmit a signal including a request for updating an address table used in the controller 130. As an alternative, a signal including a request for reallocating the address of the defective functional component to the SFU 180 may be transmitted to the controller 130. In other words, the existing address of the SFU 180 may be revoked and replaced by an address of the defective functional component.

In FIG. 7, the ICT 170 is shown to be included in the NPU 100, but may be disposed outside the NPU 100 as described above. In this case, the ICT 170 may be referred to be as an out-system component tester (OCT).

Hereinafter, for deeper understanding of the above-mentioned content, it will be described in more detail with a table of contents.

I. Why Testing During Runtime is Important

In order to prevent potential accidents which may be caused by hardware defects in the autonomous computing system, various studies have been conducted.

Among various tests, a pre-deployment test is included. According to this test technique, all hardware designs are checked before selling the product to clients. After the manufacturing, the design is tested from various viewpoints to detect and correct various problems which may be found during the actual operation. For example, in order to test a chip design, a test pattern is provided to perform the scanning of an input and inspection for an output result. Even though this technique may minimize a potential problem for the hardware design before the shipment of the products, the problems of the defect during the runtime which may be caused due to the aging of the integrated circuits (ICs), external environments, and vulnerabilities of the complex designs cannot be solved.

As described above, the above-described pre-deployment test cannot effectively solve the hardware defects so that the inventor began to be interested in test methods during the runtime.

From a viewpoint of test mechanism, the pre-deployment test and the post-deployment test seem to be similar, but there is an obvious difference in when the test can be performed. Specifically, the pre-deployment test may be performed only at a specific time and generally may be allowed only shortly after the manufacturing. In contrast, the test during the runtime may be performed at any time in a normal operation situation.

There may be two test techniques for the test during the runtime including a function test and a scan test.

According to the function test, a test input is generated and an output result obtained by inputting the generated test input to an original design is compared with an intended pattern. Alternatively, based on an original design, according to the function test, input and output signals are monitored to detect an abnormality.

According to the scan test, architectures for the scan test are inserted into the original design and various test patterns, as many as possible, need to be created. As described, after preparing the scan architectures and the test patterns, the test during the runtime may be performed in various ways.

In order to perform the scan test, the ICT may connect the plurality of flip-flops in each CUT, inject the test input to at least one flip-flop, and acquire a test result from an operation of a combinational logic of the flip-flop to analyze whether the CUT is defective or normal during the runtime.

Figure 8:
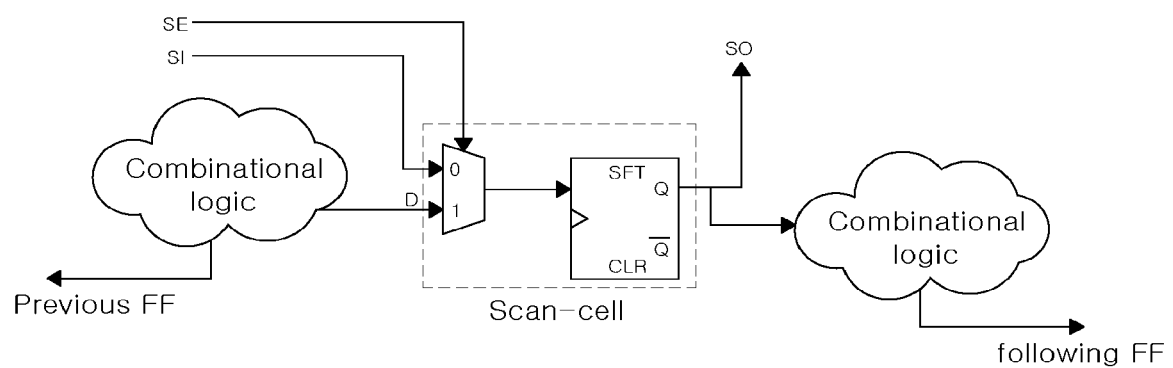
FIG. 8 is a view illustrating an example of scanning a flip-flop.

FIG. 8 illustrates an example of scanning a flip-flop.

In order to more easily design the hardware and minimize the manufacturing defect, it is very important to apply a design for testability (DFT).

To this end, an architecture for the scan test reflects the design (DFT), and a test range with a specific ratio for all detectable defects is defined to perform the test.

When D-type flip-flops are used, the architecture for the scan test may easily reflect the design. During the test, all flip-flops in the CUT may operate as scan flip-flops including D-flip-flops and multiplexers.

As compared with the normal D-type flip-flop, as shown in FIG. 8, the flip-flop may use two additional ports, that is, ports for scan enable (SE) and scan in (SI) signals, respectively. The SI port is for a test input, and the SE port enables switching between the D input for a normal operation and the test input (SI port) for a test operation.

Figure 9:
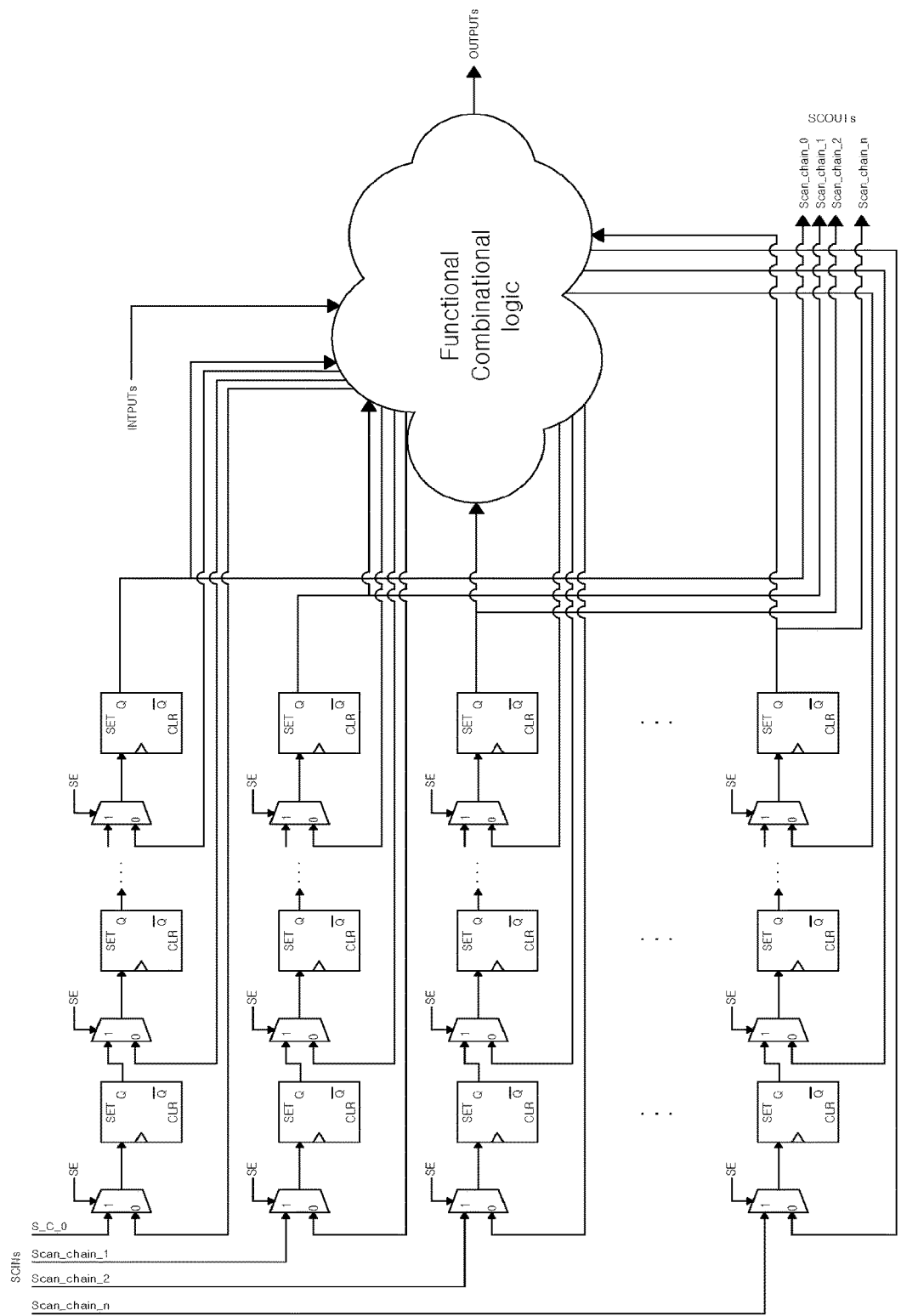
FIG. 9 is a view illustrating an example in which an architecture for scan test is added in a hardware design.

FIG. 9 illustrates an example in which an architecture for scan test is added in a hardware design.

As illustrated in FIG. 9, all the SE ports of the scan flip-flops are connected in common, and the SI port of each flip-flop is connected to the Q port of a preceding flip-flop or to another scan input port, and the Q port of each flip-flop is connected to the SI port of a subsequent flip-flop.

These connections create multiple scan chains. That is, the flip-flops are threaded to each other to create a scan chain.

When the SE (scan_enable) port is enabled, all scan flip-flops transmit data from the SI port to the Q port, via the flip-flop, and thus the data may be transmitted from a scan_in port to a corresponding scan_out port. All the flip-flops on each scan chain shift the test input from the scan_in port to the scan_out port.

The smaller the number of flip-flops on the scan chain, the faster the speed of shifting the data. However, the number of flip-flops on each scan chain and the number of scan chains are dependent on each other. The more scan chains created, the fewer flip-flops on each scan chain.

II. Test Via ICT

There may be two test techniques, namely, a functional test and a scan test.

The functional test is to generate a test input, input the generated test input to the original design, and compare the output result with an intended pattern. Alternatively, based on the original design, the functional test may monitor input and output signals to detect anomalies. Alternatively, based on the original design, the functional test may monitor input and output signals to detect anomalies.

In the scan test, in order to analyze during operation whether the CUT is defective or normal, a plurality of flip-flops in each CUT are connected to each other, a test input is injected into at least one flip-flop, and a test result is obtained from an operation of a coupling logic of the flip-flops.

The above-described test is performed as a background task so that the test may be performed without degrading a system performance. Based on the monitoring of an operation of a component to be tested, the ICT may determine whether the component is in an idle state. When the component is in an idle state, the test is performed so that the degradation of the system performance may not be caused. The ICT consistently monitors the operation state of the CUT on the system bus and the CUT may respond to an unexpected access. When there is access to the CUT, an operation of the CUT is switched from a test operation to a normal operation to recover the CUT and come back the CUT to the normal operation. A slight time delay may occur for the switching. According to the present disclosure, the system bus may be efficiently used during the time delay to minimize the degradation of the system performance due to the recovery.

II-1. Increase in Complexity of Semiconductor

The design of the integrated circuit (IC) is gradually becoming more and more complex, and the degree of integration is also increasing significantly. The NPU is a semiconductor device having a very high degree of integration so that the defects of some functional components may cause the degradation of the entire system performance. Accordingly, it is becoming increasingly important to perform the test to find out the defect of the functional components in the NPU.

II-2. Necessity of Wrapper

A wrapper can be placed between each functional component and the tester, i.e., ICT or OCT, for two test techniques: functional test or scan test. According to an example, wrappers may be divided into a first group of wrappers for the function test and a second group of wrappers for the scan test. That is, the first group of wrappers may include dedicated wrappers for the function test, and the second group of wrappers may include dedicated wrappers for the scan test.

Figure 10:
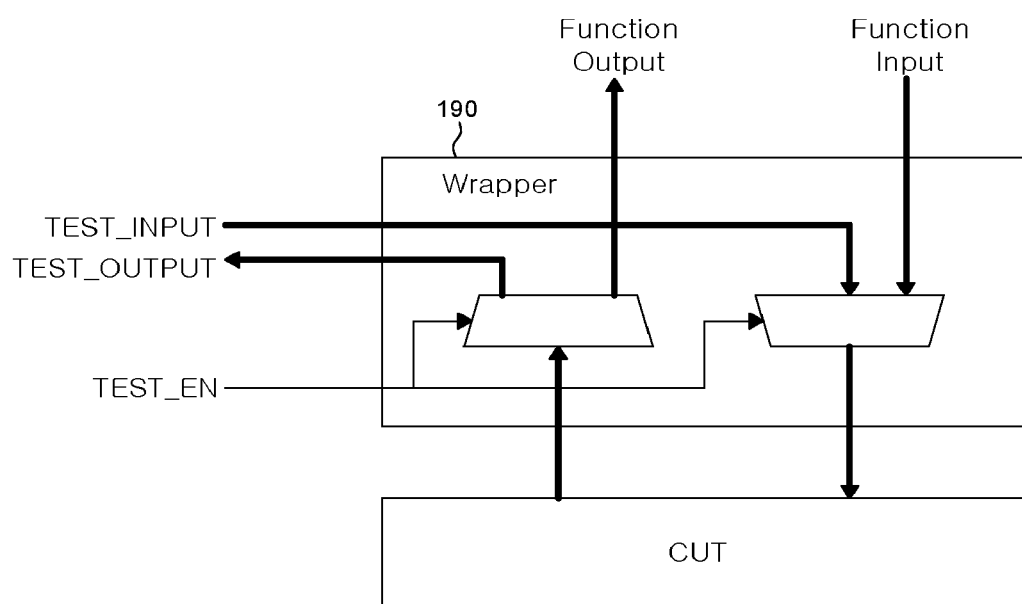
FIG. 10 is an exemplary view illustrating an operation of a wrapper.

FIG. 10 illustrates an operation of a wrapper.

As described above, the ICT may test a plurality of functional components (that is, IP, I/O interfaces, memories, etc.) in the NPU during the runtime of the NPU. To this end, during the test of the functional component selected as a CUT, a collision problem due to the access to the functional component from the system bus needs to be solved.

In order to solve the collision problem, after monitoring whether the functional component is in an idle state, when the functional component is monitored to be in an idle state, the functional component is switched from a normal operation mode to a test operation mode and then the test needs to be performed. When a collision is detected during the test, the functional component needs to be switched to the normal operation mode. After switching the operation to the normal operation mode, the functional component needs to correctly process the input data.

To this end, the illustrated wrapper 190 needs to be disposed between the functional components and the controller 130. The wrapper 190 may include multiplexer gates which selectively control the input and the output for each operation mode.

As illustrated in FIG. 10, when a TEST_ENABLE port is on, a test vector may be input to the CUT and a TEST_OUTPUT port may transmit the output. General data output from the wrapper 190 may be transmitted to other functional components via the system bus. In contrast, the test result may be directly transmitted to the ICT 170. The ICT 170 may receive a test vector for the test from an external memory or an internal memory and store the test result in the internal memory or the external memory or transmit the test result to the outside.

In order to test the NPU in the runtime, the ICT 170 may perform a plurality of processes. First, the ICT 170 may select a functional component to be tested as a CUT based on a predetermined rule. Since the NPU is in the runtime, the CUT needs to respond to the access from the system bus. Accordingly, it is effective to select a functional component in an idle state as a CUT as much as possible. To this end, the ICT 170 may monitor whether the functional component enters the idle state. When the functional component enters the idle state, the wrapper 190 may turn on the TEST_ENABLE port. The ICT 170 may inject the test vector to the CUT via the TEST_ENABLE port.

The ICT 170 may collect and analyze the test result from the CUT via the TEST_OUTPUT port of the wrapper 190. When the test result indicates that a problem is detected, the ICT 170 may perform a post action. During the test, when a general access to the CUT from the controller 130 is detected, the ICT 170 may temporally delay the access from the controller 130 and then may immediately stop (interrupt) the test operation. Thereafter, the ICT 170 may recover previous values for register setting of the CUT and turn off (disable) the TEST_ENABLE port of the wrapper 190. When a normal operation of the CUT is ready, the ICT 170 may control the wrapper 190 to return the connection for input and output with the CUT to the controller 130.

Figure 11:
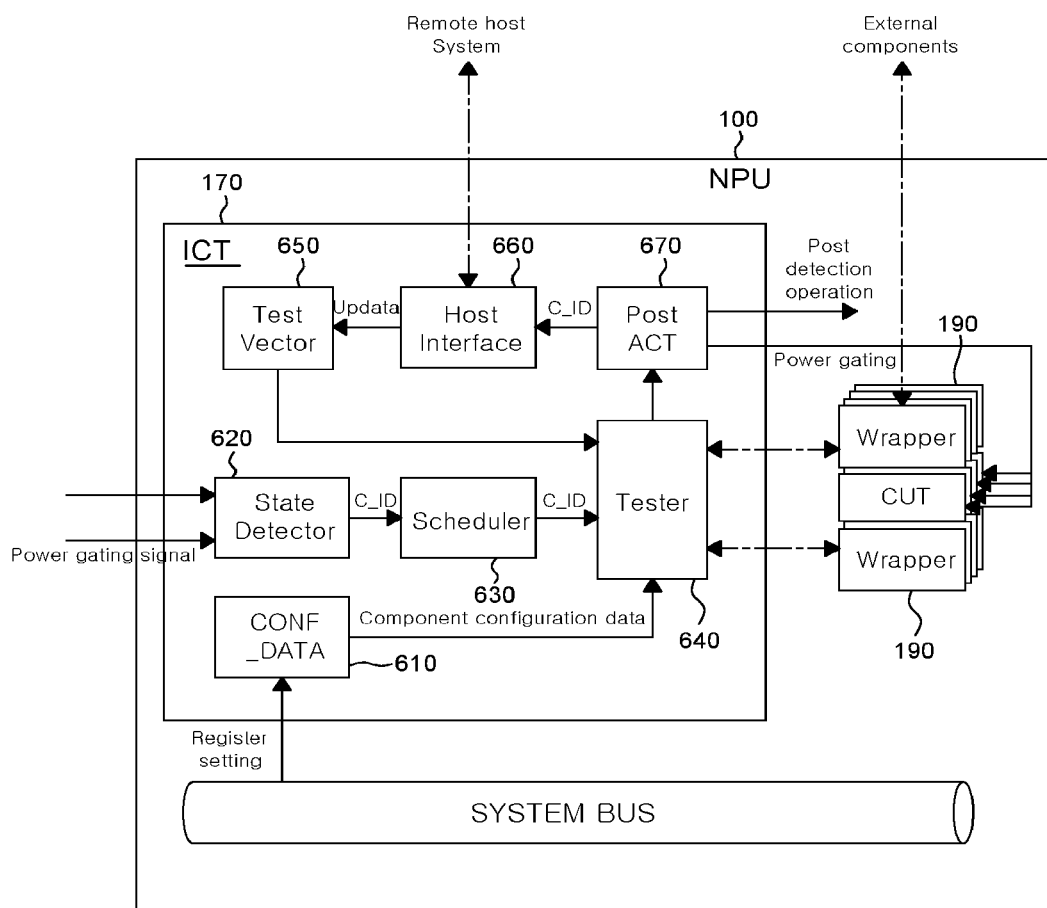
FIG. 11 is an exemplary view illustrating an internal configuration of an ICT.

FIG. 11 illustrates an internal configuration of an ICT.

Referring to FIG. 11, the ICT 170 may include a configuration data (CONF_DATA) restorer 610, a state detector 620, a scheduler 630, a tester 640, a test vector generator 650, a host interface 660, and a post action (POST_ACT) unit 670.

The state detector 620 may detect whether the functional components in the NPU are in an idle state or a busy state (or a processing state). When an arbitrary functional component enters an idle state, the state detector 620 transmits an ID (C_ID) of the functional component to the scheduler 630 to perform the test.

The scheduler 630 may manage an overall operation of the ICT 170. The scheduler 630 may receive a state of the functional component from the state detector 620 and trigger the test. The scheduler 630 may transmit the ID of the component to the tester.

The tester 640 controls the wrapper 190, transmits a test vector, acquires a test result, and then compares whether the test result matches an intended test result. Thereafter, the tester 640 may transmit the test result to the post-action unit 670. The tester 640 may restore the register setting for the functional component selected as the CUT to its original value.

The test vector generator 650 may generate a test vector (or a predefined test input data) and a corresponding intended test result. The test vector generator 650 may include a buffer, a memory interface, a memory which stores the test vector and the intended test result, and a random number generator. When the test starts, a test pattern for generating the test vector may be loaded in the buffer. The random number generator may be used to generate the test vector. The random number generator may allow the memory not to store all the test vectors, but generate various test vectors.

When the ID (for example, C_ID) of the functional component from which a problem is found is received from the tester 640, the post action unit 670 may perform the post action. The post action may isolate the defective functional component or notify a defect to the user or a remote host device.

The host interface 660 may report the functional component from which the problem is found during the test process to the user or the remote host device. If there is a change related to the test operation, the host interface 660 may notify the remote host device.

When the test is completed or the access to the functional component selected as CUT from the system bus is detected during the test process, the configuration data restorer 610 may restore the register setting of the CUT to allow the tester 640 to switch the CUT to the normal operation mode. Most of the functional components may have a specific register setting value for a normal operation.

Accordingly, the configuration data restorer 610 may store the register setting value of the functional component before performing the test and restore the register setting value to the functional component when the CUT needs to be switched to the normal operation mode.

Meanwhile, the test vector generator 650 may include at least one of a random number generator, a predefined test data storage unit, and a temporary (temp) register.

A method of testing a plurality of processing elements 110 using a random number will be described. The random number generator may generate a random number based on a predetermined seed or a programmable seed.

The ICT 170 may instruct to select at least one PE in a plurality of processing elements to start a test.

As a specific example, when it is determined that a certain percentage of PEs (e.g., 20% of all PEs) among the plurality of processing elements are in an idle state, the ICT 170 may start a test. In other words, when the ratio of idle PEs among all PEs is equal to or greater than the threshold, the test can be started.

As a specific example, the ICT 170 may select a certain percentage of PEs (e.g., 50% of PEs among all PEs) and start the test.

When the test is performed, the inference speed of the NPU, that is, IPS (inference per second) may be reduced. That is, the inference speed may be lowered according to the number of PEs to be tested. For a specific example, if 50% of PEs among all PEs are tested, the inference speed may be reduced by about 50%, and if 30% of PEs among all PEs are tested, the inference speed during testing may be reduced by about 30%.

Accordingly, according to an example, the plurality of processing elements 110 may further include additional PEs so that the speed degradation according to the test is improved. That is, the plurality of processing elements 110 may include a first group of PEs and a second group of PEs. The first group of PEs may be used for learning or inference. The second group of PEs are redundant PEs. If the test is performed on the PEs of the first group, the PEs of the second group are used for learning or inference, thereby preventing performance degradation due to the test.

For another example, when the NPU 100 operates below a predetermined inference per second (IPS) value, the ICT 170 may instruct the plurality of processing elements 110 to perform a test. Specifically, assuming that the NPU 100 can operate at a maximum of one hundred IPS, and assuming that the threshold IPS value is thirty IPS, in such a case, the ICT 170 may instruct the NPU 100 to perform a test in the remaining time when the NPU 100 operates at thirty IPS or more. For example, when the NPU 100 operates at forty IPS, the test may be performed using the remaining time for sixty IPS. Therefore, a substantial decrease in the speed of the NPU may not occur.

For another example, when the data transferred from the main memory 300 shown in FIG. 7 to the NPU internal memory 120 is delayed and the NPU 100 becomes an idle state or enters a data starvation period, the ICT 170 may instruct the plurality of processing elements 110 to perform a test.

When the test is performed on the plurality of processing elements 110, a register file RF corresponding to a PE is initialized with predetermined test input data, respectively, and the corresponding PE may perform inference according to the test input data in the register file RF.

When the test is performed on the plurality of processing elements 110, the random number generator may generate a random number as described above. Then, the register file RF is initialized by the generated random number, and the corresponding PE performs inference according to the random number in the register file RF.

The register file RF may reset flip-flops in each PE and transmit test input data to the PEs as described above.

Each registry file RF may be, for example, 1 Kb in size.

II-3. To Detect Idle State of Functional Component

Figure 12:
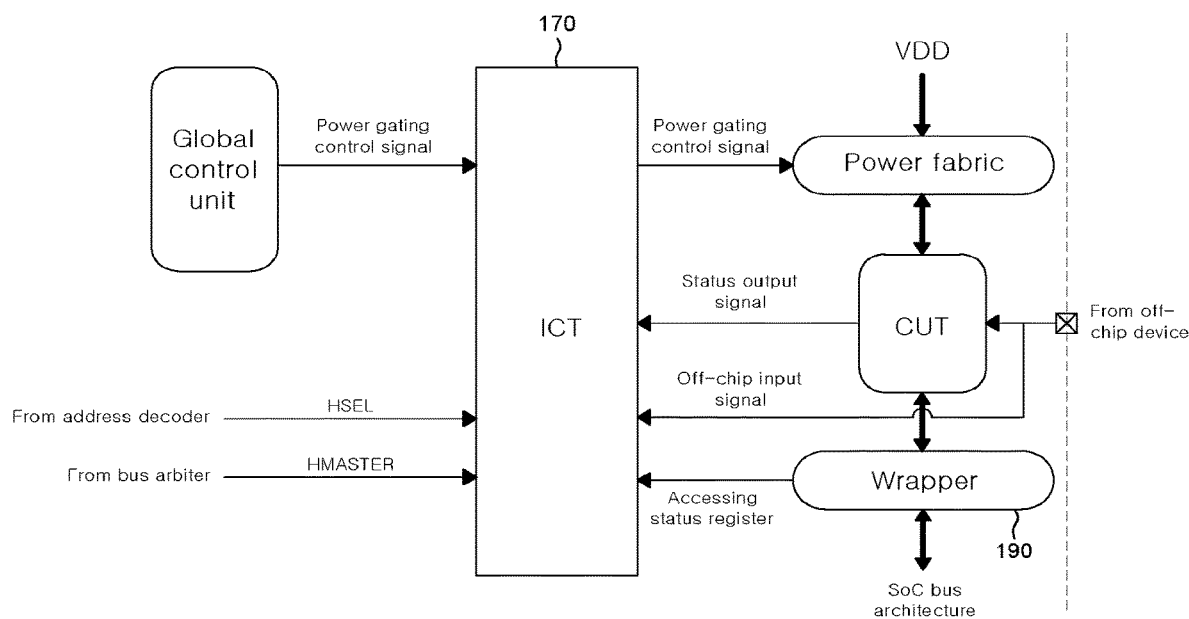
FIG. 12 is a block diagram specifically illustrating an operation of monitoring whether a functional component is in an idle state, by an ICT.

FIG. 12 illustrates an operation of monitoring whether a functional component is in an idle state by an ICT.

In order to detect whether the functional component is in an idle state during the normal operation mode, the ICT 170 may use one or both of two techniques.

First, the ICT 170 may monitor whether the component is in an idle state or is in use, based on hardware signals which directly or indirectly indicate whether to operate. For example, the ICT 170 may monitor a power gating control signal to disconnect the connection of the functional component to reduce the power consumption of the functional component. Further, the ICT 170 may determine whether the functional component is in an idle state, based on an output signal which directly or indirectly indicates whether the component operates or a value of a register which stores information related to the operation in the functional component.

Second, the ICT 170 monitors a signal from a system bus via the wrapper 190 or monitors an input/output port of the functional component during a specific time period to determine whether the functional component is in an idle state.

II-4. Processing of Access Collision

Figure 13:
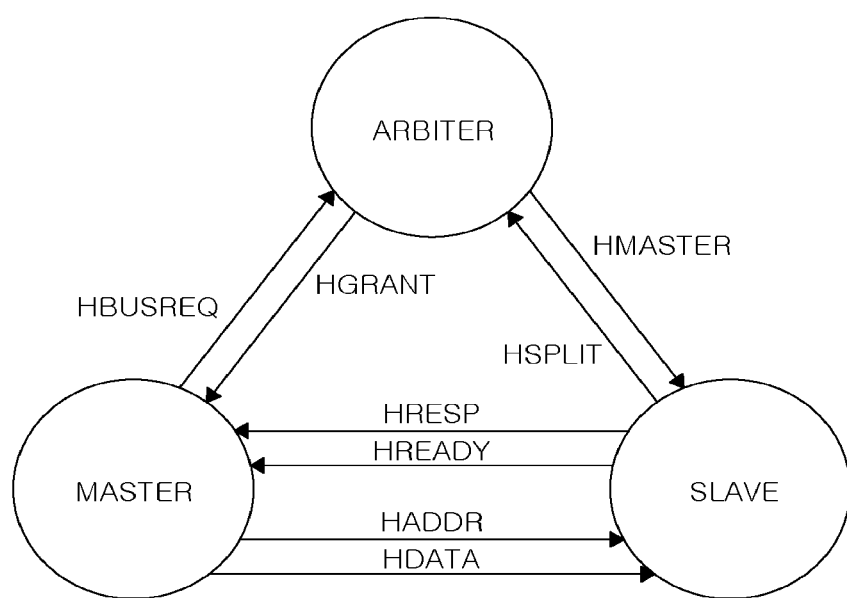
FIG. 13 is an exemplary view illustrating an operation between a master, a slave, and an arbiter which operate on a system bus.

FIG. 13 illustrates an operation between a master, a slave, and an arbiter which operate on a system bus.

The master on the system bus may be an entity which uses a slave, the slave may be an entity used by the master, and the arbiter may be an entity which performs arbitration and determination between the master and the slave.

The slave illustrated in FIG. 13 may be a functional component selected as a CUT, and the arbiter may be an ICT.

When an access for a normal operation is detected from the controller 130 while the functional component selected as a CUT is being tested, the ICT 170 may require a predetermined amount of time or more to recover the CUT to its previous state. The ICT 170 may temporally deactivate (or de-assert) an HREADY signal to temporally stop the system access from the master, stop (interrupt) the test activity, recover the register setting of the CUT, and change a direction of data which is input to or output from the wrapper. When the CUT which is the slave is ready to perform the task with the master, the HREADY signal may be turned on. However, according to the present disclosure, the ICT may induce some time delay for a bus separation operation. A specific process will be described below.

First, the master activates (or asserts) an HBUSREQ signal for a bus access. Second, during the arbitration or determination process, the arbiter activates (or asserts) an HGRANT signal to allow the bus access. By doing this, the master may transmit the data to the CUT which is a slave via the system bus. If the ICT is performing a processing operation for a test, the ICT transmits an HSPLIT signal to the arbiter together with a bit indicating a current master and activates (or asserts) a SPLIT signal in the HRESP signal, simultaneously. After the activation (assertion), the master nullifies the access to the CUT and the arbiter performs the arbitration or determination process without having intervention of the master. When the CUT is ready to respond to the access from the master, the ICT deactivates the HSPLIT signal and the master waits for a grant from the arbiter to resume the task to access the CUT.

Figure 14:
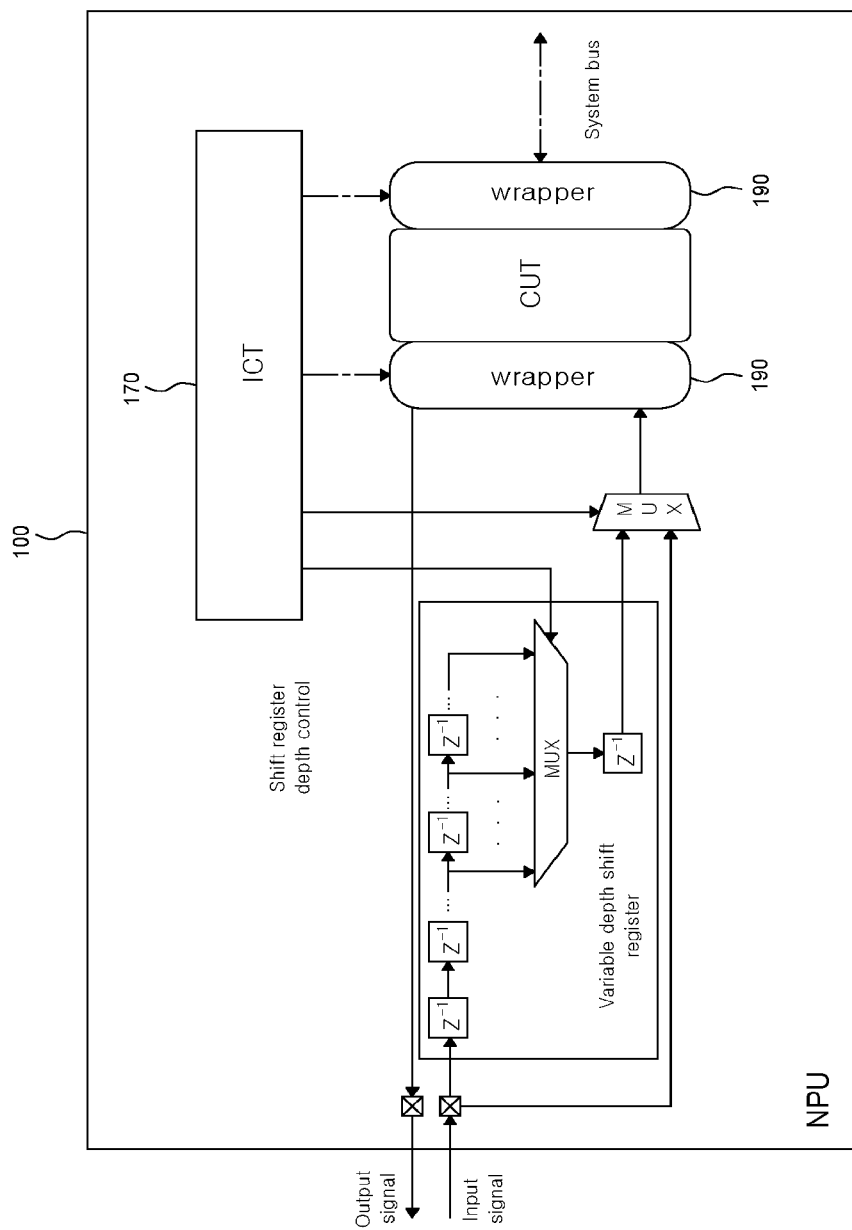
FIG. 14 is a view illustrating an example in which a shift register is added in a chip.

FIG. 14 illustrates an example in which a shift register is added in an NPU.

The inventor of the present disclosure has recognized that the access to the I/O interface may not cause the collision on the system bus. For example, when the target CUT is a master, an external device connected through the I/O interface does not request the access for itself so that the collision may not occur. Accordingly, it may be effective to focus only on solving the collision problem generated when the CUT is a slave.

Instead, in order to delay data which is transmitted from the external device to the CUT during the restoring time, a shift register may be added between a port of the NPU and the external interface port of the CUT.

The shift register may be added to store the access signal input from the outside of the NPU while the CUT is restored. When the CUT is ready, the access signals are regenerated by the shift register to be output.

A depth of the shift register may be determined by the number of clock cycles required to restore the CUT to a normal operation. Specifically, when one or more functional components need to receive a signal from the outside of the NPU, the depth of the shift register may be variable. In this case, the depth of the shift register may be determined by the ICT.

II-5. Operation Order of ICT

Figure 15:
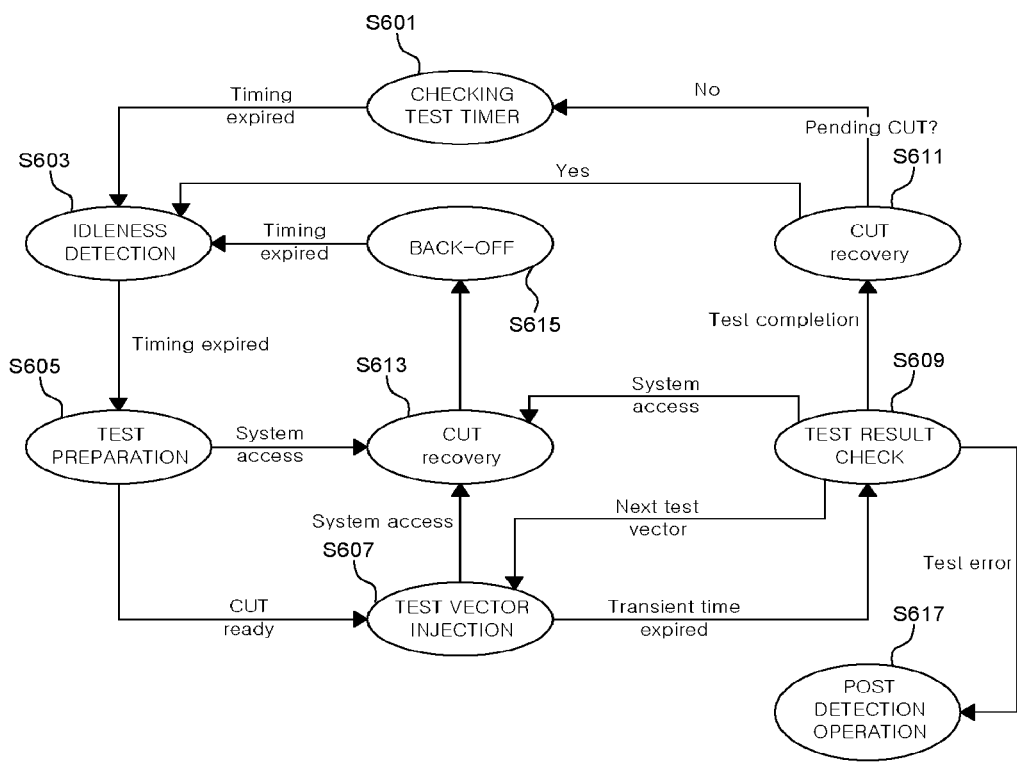
FIG. 15 is an exemplary view illustrating an operation order of an ICT.

FIG. 15 illustrates an operation order of an ICT.

Referring to FIG. 15, when a timer related to the test start of the ICT in the runtime expires (S601), the ICT monitors whether an arbitrary functional component is in an idle state and detects a functional component in an idle state (S603).

By doing this, the ICT performs a test preparation process (S605). The test preparation process may include selecting the functional component as a CUT, isolating the functional component selected as a CUT from the system bus, and generating a test vector as test input data. The isolation from the system bus may mean that the ICT changes the direction of the input and the output on the wrapper which communicates with the functional component selected as the CUT.

The ICT injects the test vector which is the test input data into the CUT (S607).

When the test is normally completed, the ICT checks the test result (S609). For the checking, the ICT may compare whether the test result matches the intended test result.

When the test result indicates that there is no problem in the functional component selected as the CUT (that is, no defect or damage), the ICT may recover the functional component to a normal operation state (S611).

In the meantime, when an access to the functional component selected as the CUT is detected from the system bus during the test preparation or the test, the ICT may recover the functional component selected as the CUT to a normal operation state (S613). The recovery may mean that a register setting value of the functional component selected as the CUT is recovered and the direction of the input and the output returns to an original state on the wrapper which communicates with the functional component selected as the CUT.

In this case, the ICT drives a back-off timer (S615) and, when the back-off timer is expired, the operation may return to the step S603.

In the meantime, when the test result indicates that there is a problem in the functional component selected as the CUT (that is, the defect or damage), the ICT may perform the post-detection operation (S617).

II-6. Test for Internal Memory

The internal memory 120 may include a plurality of memory instances. The internal memory 120 may further include extra memory instances. That is, the internal memory 120 may include a first group of memory instances and a second group of memory instances. If the test is performed on the memory instances of the first group, the memory instances of the second group are used, thereby solving the problem of insufficient storage capacity.

Figure 16:
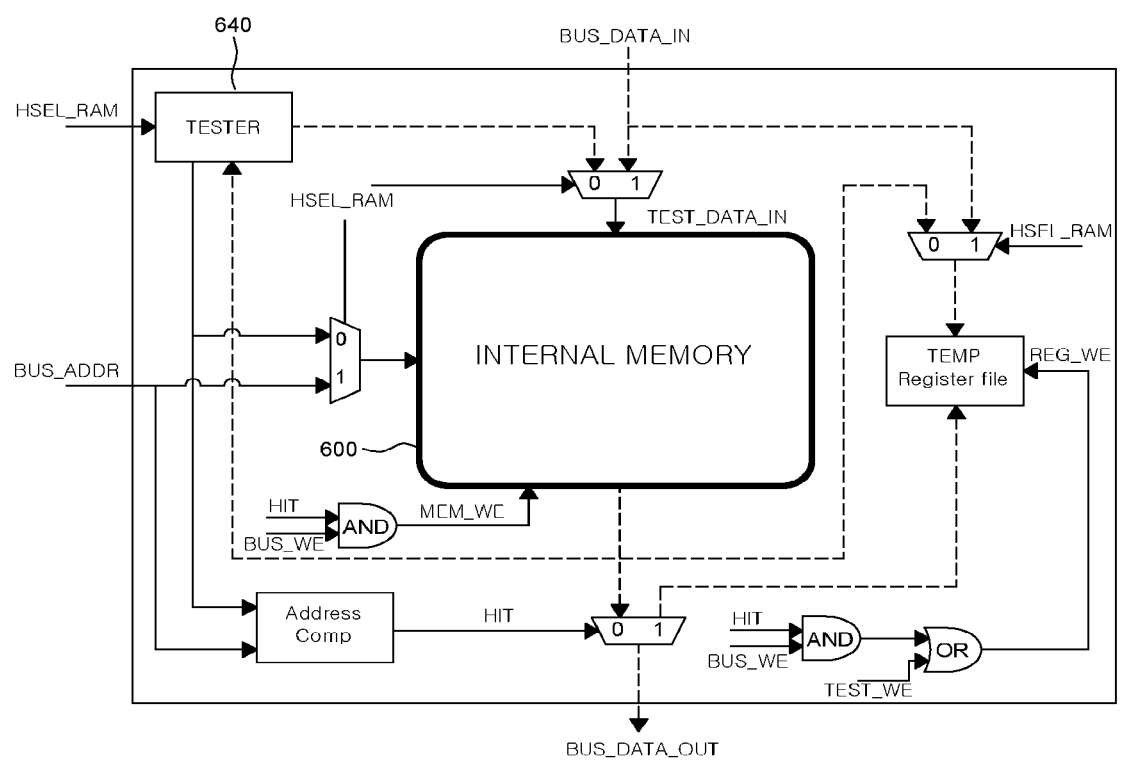
FIG. 16 is a block diagram illustrating for easy understanding of a test process of an internal memory.

FIG. 16 illustrates a test process of an internal memory.

The test for the internal memory may be different from the test for the functional component. Hereinafter, two test techniques for the internal memory, that is, the internal memory 120 as illustrated in FIG. 1, FIG. 3, FIG. 6A, and FIG. 6B will be proposed.

A first technique is a technique of detecting an error using an error detection code during a process of reading data from the internal memory. If an error detection code acquired during the reading process is different from a predetermined error detection code, the ICT may determine the code as an error.

A second technique is a technique of performing a read-write test in a hard way during a normal operation.

FIG. 16 illustrates the second technique. A test logic which encloses the internal memory may perform the read-write test during the runtime of the system and bypass the access from the system bus. In order to completely process the test, the tester in the ICT may be responsible for the address management. The illustrated temporally register file may temporally store original data which is prone to be deleted due to the test. When the test is completed, the original data in the temporary register file may be recorded in the internal memory again.

If an unpredictable access occurs during the test, data on the system bus may be recorded in the temporary register file, and in contrast, the data in the temporary register file may move to the system bus.

The test technique as described above may be applied not only to the internal memory, but also to the external memory in the same way.

II-7. Operation after Test

When there is a hardware defect in the NPU, the operation after the test may be very important. For example, a user is notified of the defect in order to recommend stopping usage. To this end, the post action unit 670 of FIG. 11 may provide information about the functional component from which the defect is detected and information about test input data (that is, a test vector) which causes the defect. The above-described information may allow the user to know the position of the defective functional component. The usage of the functional component from which the defect is detected needs to be stopped and isolated. In order to prevent the defective functional component from degrading the performance of the entire system, the output signal of the functional component may be replaced by a predetermined signal. Alternatively, the functional component may be reset or gated. Alternatively, the power gating may be performed on the functional component.

In the meantime, when the functional component is isolated, the NPU may face another problem. Therefore, even though some functional components have defects, a method for allowing the NPU to still operate needs to be proposed. For example, when the NPU is mounted in a product which requires a high reliability, the NPU needs to further include a spare for some functional components. If some functional components have defects, the spare may operate instead of the functional component. However, when some functional components are duplicated, it may increase an area of the semiconductor device. In order to solve this problem, it may be effective to add a programmable logic in the NPU.

III. Function Test During Runtime or Test for Combination of Functions

Figure 17:
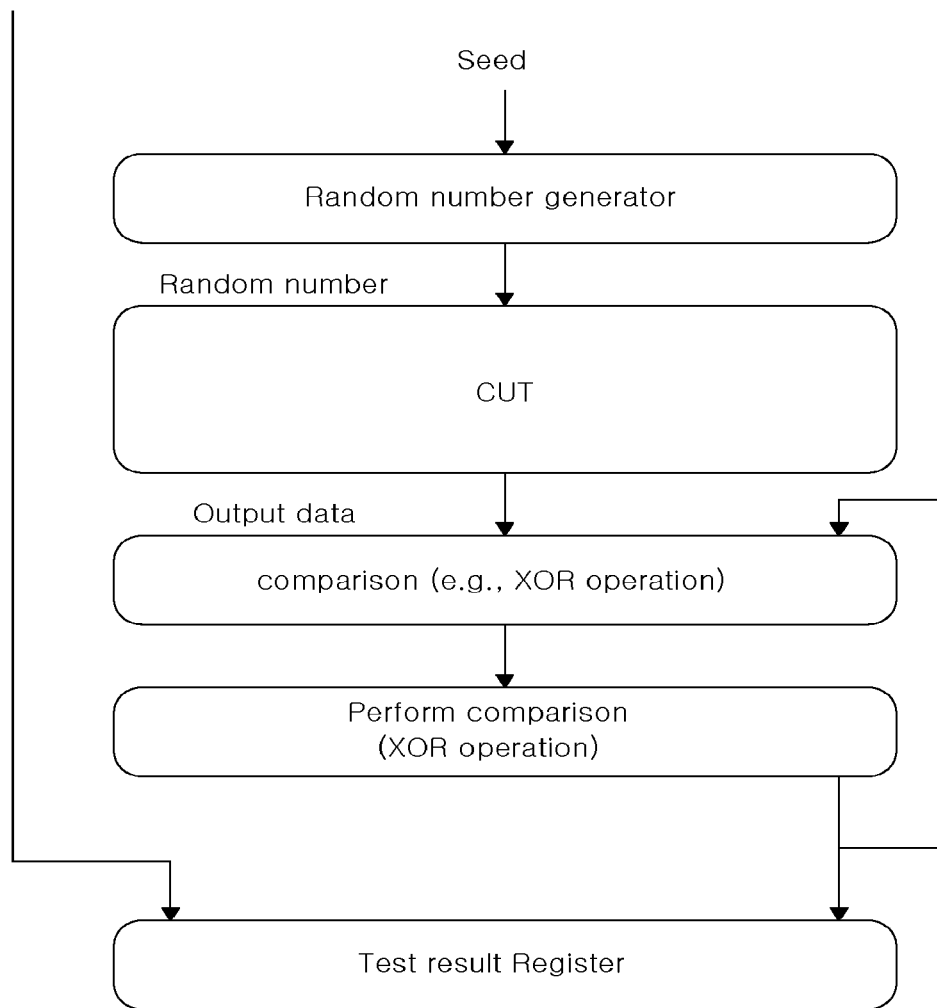
FIG. 17 is an exemplary view illustrating a process of testing a function using a random number generator.

FIG. 17 illustrates a process of testing a function using a random number generator.

The function test is a test of injecting test input data (for example, a test vector) into a CUT and comparing whether an output from the CUT matches an intended output. In order to correctly evaluate based on the comparison, each input data needs to accurately induce an intended output. A test range of the test input data needs to be high to detect all defects.

In a specific design, there may be two test input data for the function test. First, a random number generator which is connected to a comparison operation (e.g., an XOR operation) may be used for the test operation illustrated in FIG. 17. Generally, the random number generator may generate a pseudo random number stream based on an input seed. The random number stream is injected into the CUT via the wrapper and the output is accumulated and stored in the test result register by means of the XOR operation. When the test is completed, the values stored in the test result register may be compared with the intended result corresponding to the test input data. If there is a difference in the comparison result, an error notification may be issued.

Second, all test patterns for test input data and corresponding prediction results may be fixed, respectively and stored in the internal memory in the NPU or an external memory. When the test input data (that is, a test vector) from the memory is input to the CUT, the output from the CUT and the intended result corresponding to the test input data may be compared.

In order to perform the function test during the runtime of the NPU, the ICT plays an important role to transmit data and communicate with the system bus, and monitor the state of the CUT. Specifically, when the CUT is in an idle state, the ICT needs to determine when the test is performed. During the test, the random number generator generates a random number stream as test input data and transmits the test input data to the CUT. If there is a difference between the test result and the intended test result, the ICT transmits the information to the post action unit.

During the function test, the functional components may be used so that generally, a frequency for the test operation needs to be lower than or equal to a frequency for a normal operation to avoid the difference of the timing (that is, timing violation). In order to perform the test in real time during the normal operation, it is effective to perform the test when the functional component is in an idle state. Therefore, there is no choice but to perform the test at a high frequency.

IV. Test in Runtime Using Combination of DFT (Design for Testability) and ICT

IV-1. Multiple Clocks

Figure 18A:
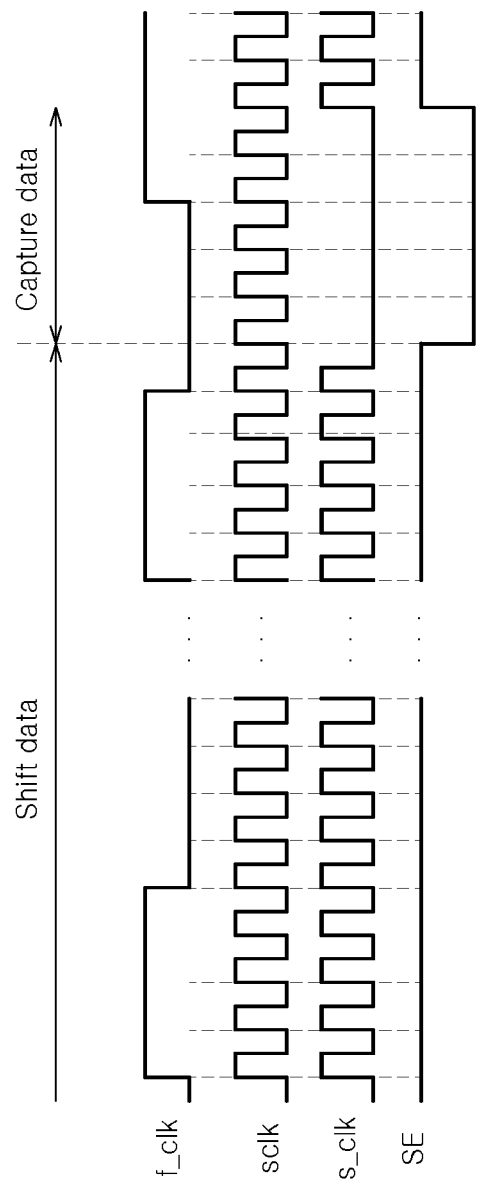
FIG. 18A is a view illustrating an example of multiple clocks.
Figure 18B:
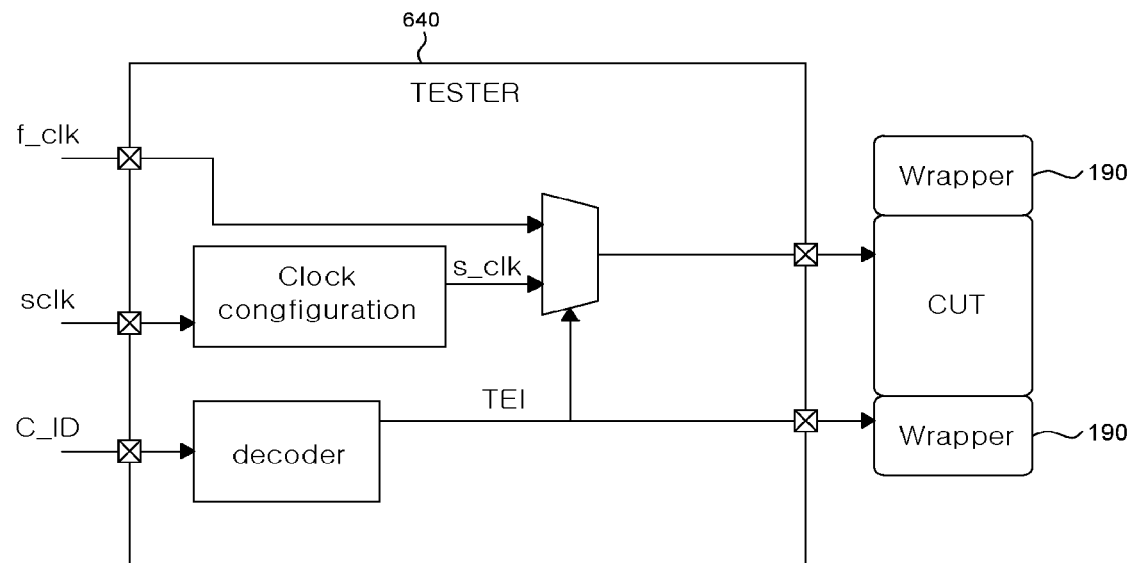
FIG. 18B is an exemplary view illustrating an operation of a tester under the multiple clocks.
Figure 18C:
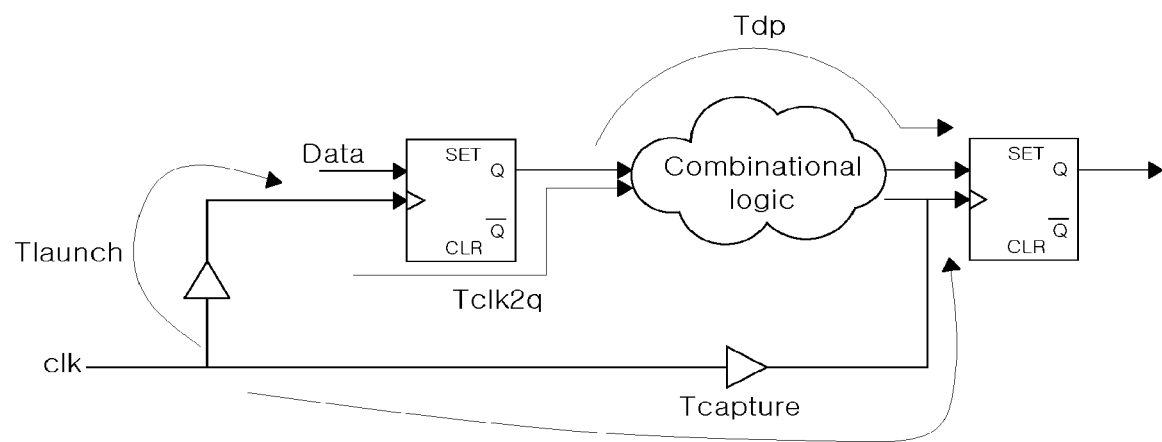
FIG. 18C is a view illustrating a path of test input data.

FIG. 18A illustrates an example of multiple clocks, FIG. 18B is an exemplary view illustrating an operation of a tester under the multiple clocks, and FIG. 18C illustrates a path of test input data.

During the test, with regard to the injection of one test input data (that is, a test vector), there may be two techniques.

A first technique is to use a time period to shift data as illustrated in FIG. 18A. An SE (scan enable) port is enabled, and the Q output of a flip-flop is connected to the D input of another flip-flop. This connection may make a scan chain which connects the scan input to the scan output through a chain of the flip-flops.

Therefore, all the designed combinational logics may be disabled and there may be no reference logic cell for a data path (that is, a path from one flip-flop to another flip-flop).

Although not shown, $T_{cycle}$ can be defined as a clock cycle for one operation, $T_{launch}$ is defined as a time delay from a clock source of a first flip-flop to a first port, $T_{capture}$ is defined as a time delay from the clock source to a second port of a second flip-flop, $T_{clk2q}$ is defined as a time delay from the clock (CK) port of the first flip-flop to its Q port, and $T_{dp-max}$ is defined as a time delay from the Q port of the first flip-flop to the D port of the second flip-flop. Thus, $T_{cycle} > T_{launch} + T_{clk2q} + T_{dp-max} + T_{setup} + T_{margin} - T_{capture}$. $T_{setup}$ is the time required for setup, and $T_{margin}$ is the allowable slack time.

When the scan test is enabled, $T_{dp-max}$ may be reduced to zero from a viewpoint of the scan test. Ideally, $T_{dp-max}$ may be zero. However, in order to solve the timing violation, when a plurality of inverters or buffers is added, the time delay may be larger than zero.

As an alternative, $T_{dp-max} >> T_{clk2q} + T_{setup} + T_{launch} - T_{capture}$. During a time period to shift data, it may be processed at a higher frequency.

During a time period to capture data as illustrated in FIG. 18A, a scan enable pin is deactivated and thus the functional component is re-activated and a combinational logic may be activated on the data path. In order to solve the violation of the timing while data is captured, a time delay may be added between a clock cycle located at one end in a time period to shift data and a clock cycle located at one end in a time period to capture data.

The delay between clock cycles may be greater than or equal to a clock cycle for a normal operation. In order to detect when the time period to shift data is completed based on a maximum number of flip-flops on the scan chain corresponding to a shifted value, a counter is added and in order to manage the time delay in a time period to capture data, another counter may be added.

In FIG. 18B, a tester 640 receives two input clock signals. One is f_clk used for a normal operation, and the other is sclk used to shift data. A clock configuration is inserted into the tester 640, so that the sclk signal may be set to be used in both the period to shift data and the period to capture data.

In order to control the switching between f_clk for a normal operation and sclk for test operation, a TE signal corresponding to the CUT may be used. When an ID (that is, C-ID) of the component is received from the scheduler, the test block in the ICT is ready to test. TEs of the CUTs which are available through the decoder may enable the test process.

Figure 19A:
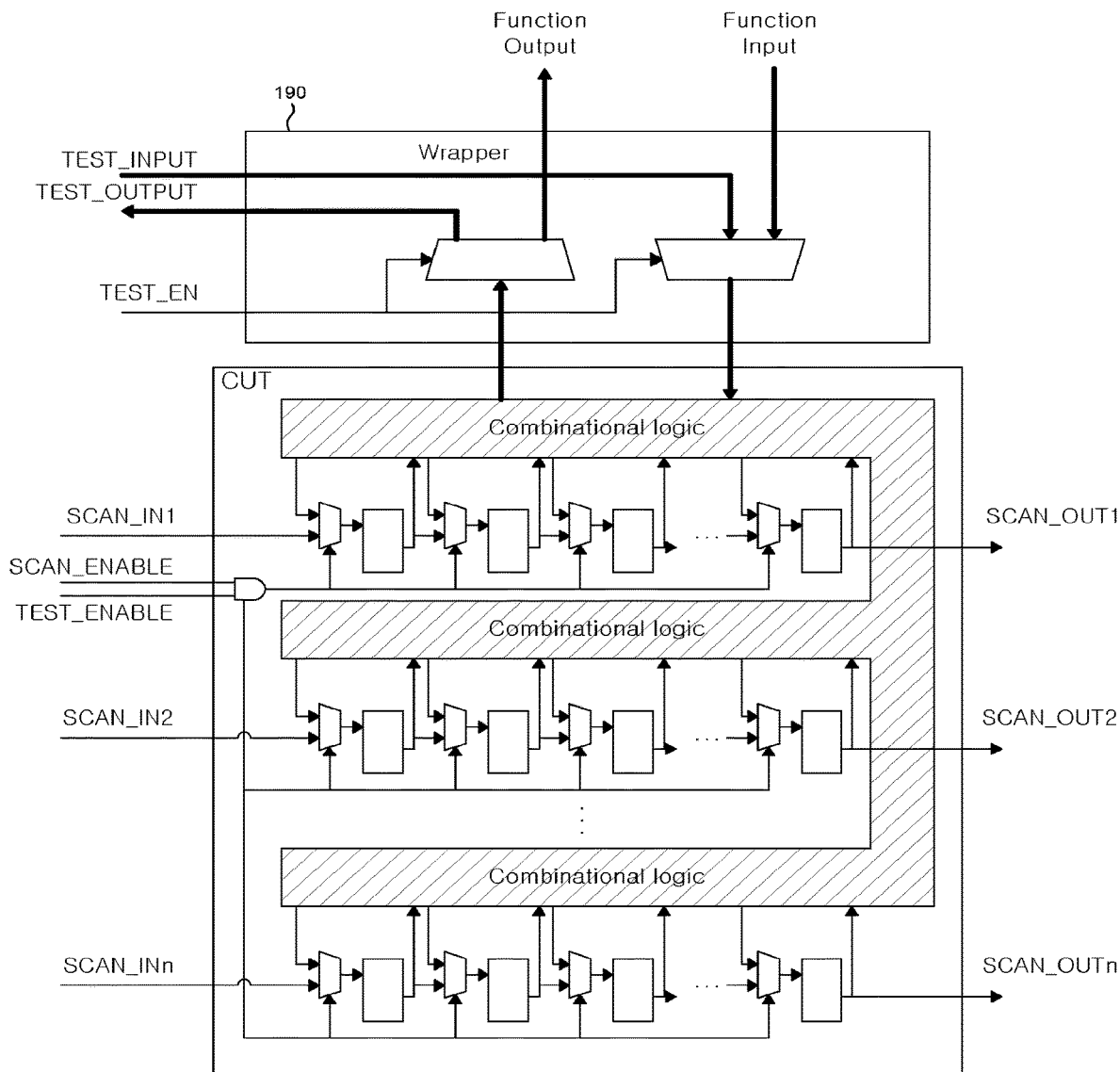
FIG. 19A is a view illustrating an example of a functional component.
Figure 19B:
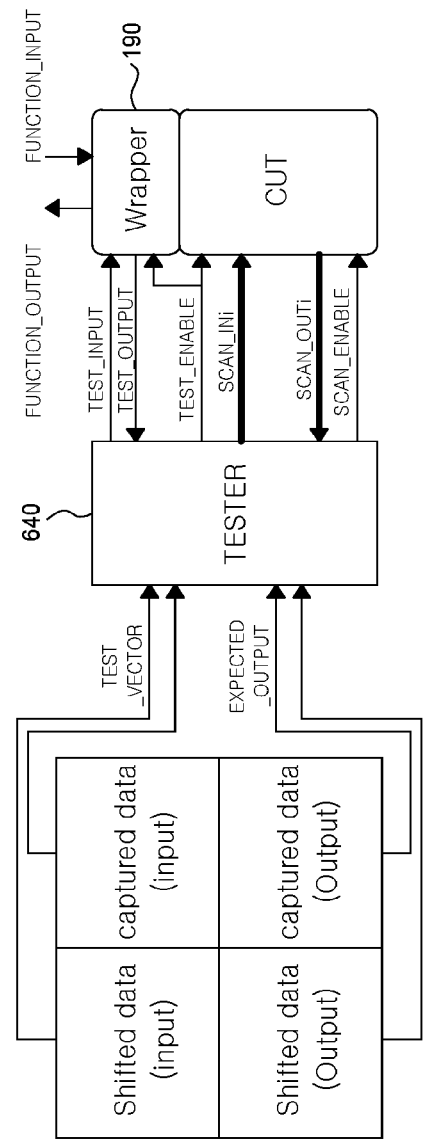
FIG. 19B is a view illustrating an example of test input data (for example, a test vector) injected into a tester in an ICT.

FIG. 19A illustrates an example of a functional component, and FIG. 19B illustrates an example that test input data (for example, a test vector) is injected into a tester in an ICT.

In order to apply a design for testability (DFT) in the test during the runtime, a scan chain is added in the CUT and all flip-flops may be enclosed by the scan flip-flop. A scan input, a scan output, and TEST_ENABLE, and SCAN_ENABLE signals are connected to the tester in the ICT and an original input and an original output of the CUT may communicate with the system bus via the tester and the wrapper.

As illustrated in FIG. 19B, from a viewpoint of the memory which stores the test pattern, the block may be divided into four parts. A first part is a part which stores an input shift vector, a second part is a part which stores an output shift vector, a third part is a part which stores an input capture vector, and a fourth part is a part which stores an output capture vector. In order to start the test, the input shift data is loaded from the memory to input to the CUT through the tester.

In each scan chain, after all the flip-flops are filled with the shift vector, when the first input capture vector including a value for a scan input and an initial input is loaded, a first output capture vector including values for all scan outputs and initial outputs is loaded, and then compared with the actual output capture data. Each loaded shift vector is accompanied by output shift data and the actual output data and the output shift vector or an output capture vector may be compared.

Figure 20:
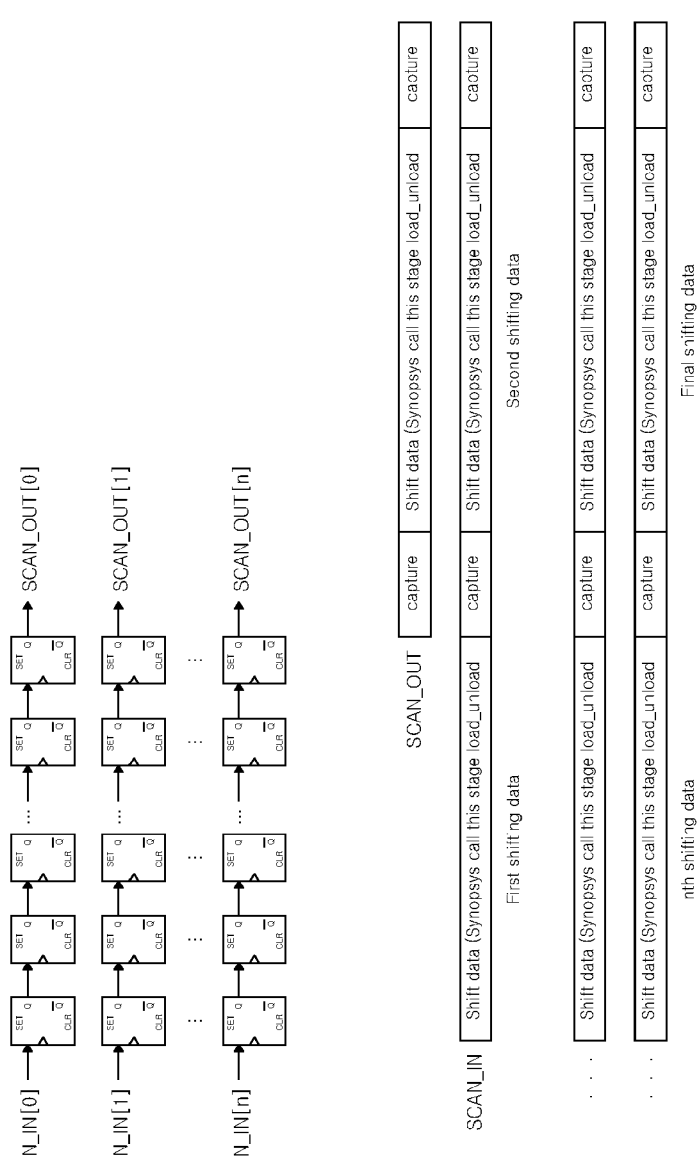
FIG. 20 is a view illustrating a test process.
Figure 21:
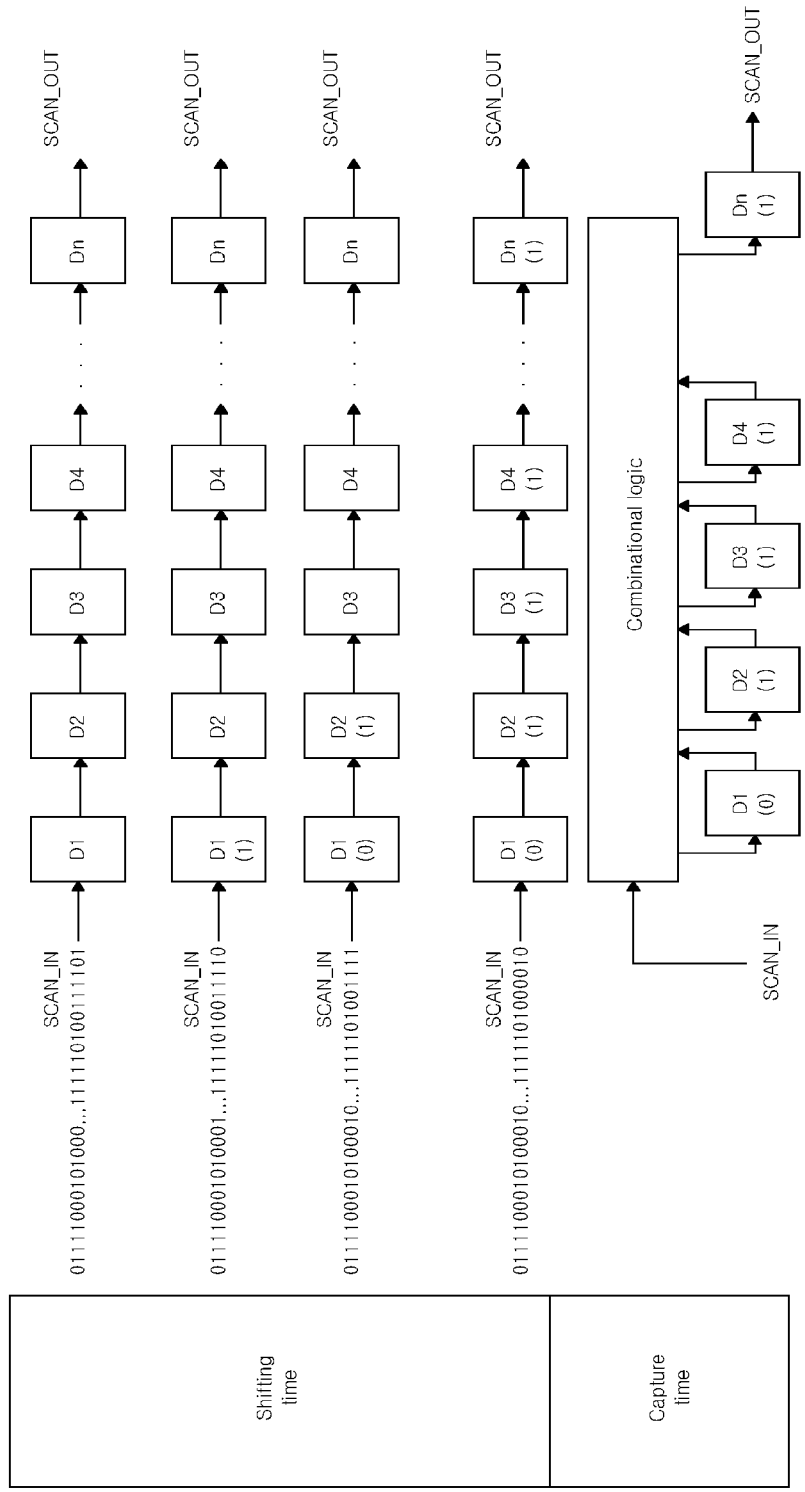
FIG. 21 is a view illustrating an example of shift data and capture data during a test process.

FIG. 20 illustrates a test process, and FIG. 21 illustrates an example of shift data and capture data during a test process.

During a step of shifting data, when a scan_enable port is enabled, a SCAN_IN port may be connected to the SCAN_OUT port through the flip-flops without the combinational logic. An input shift vector may be loaded in all scan chains until all flop-flops have values shifted from the input shift vector. One shift value may pass through one flip-flop at each clock cycle. That is, the D port of a preceding flip-flop may be connected to the D port of a subsequent flip-flop.

When during a capturing step, a scan_enable port is disabled, and none of the D ports of any flip-flop is connected to the Q port of a preceded flip-flop but may be directly connected to the combinational logic.

The capture vector output may be loaded in the Q output of all the flip-flops through the combinational logic at the positive (+) edge of a clock cycle. In a first data capturing step, a data transmitting process is prepared to compare the output data with intended output data, and then the comparison is performed at the positive-going edge of every clock cycle. All test vector inputs are loaded, and the process returns to the first data shift step and each process starts over.

FIG. 21 illustrates shifting and capturing processes. A rectangular box in FIG. 21 indicates a flip-flop in each scan chain, and all flip-flops are filled at the end of the data shifting step.

Figure 22:
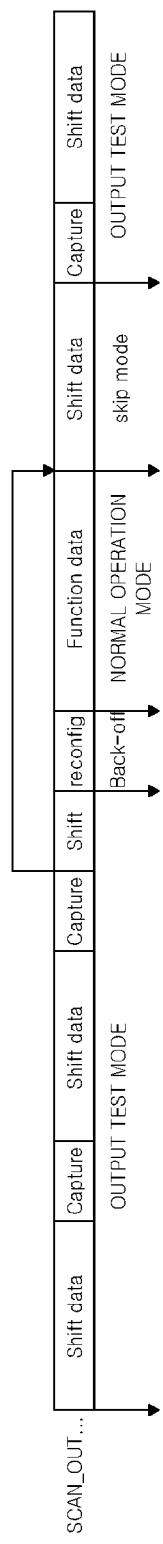
FIG. 22 is a view illustrating an example of switching a test mode to a normal operation mode.

FIG. 22 illustrates an example of switching a test mode to a normal operation mode.

As known with reference to FIG. 22, a data shifting process and a capturing step may be repeated during the output test mode. If there is an access to the CUT, the CUT is recovered to a normal operation mode and the test may be backed off. Thereafter, the skip mode is performed during a predetermined time period and then the output test mode may be performed again.

Figure 23:
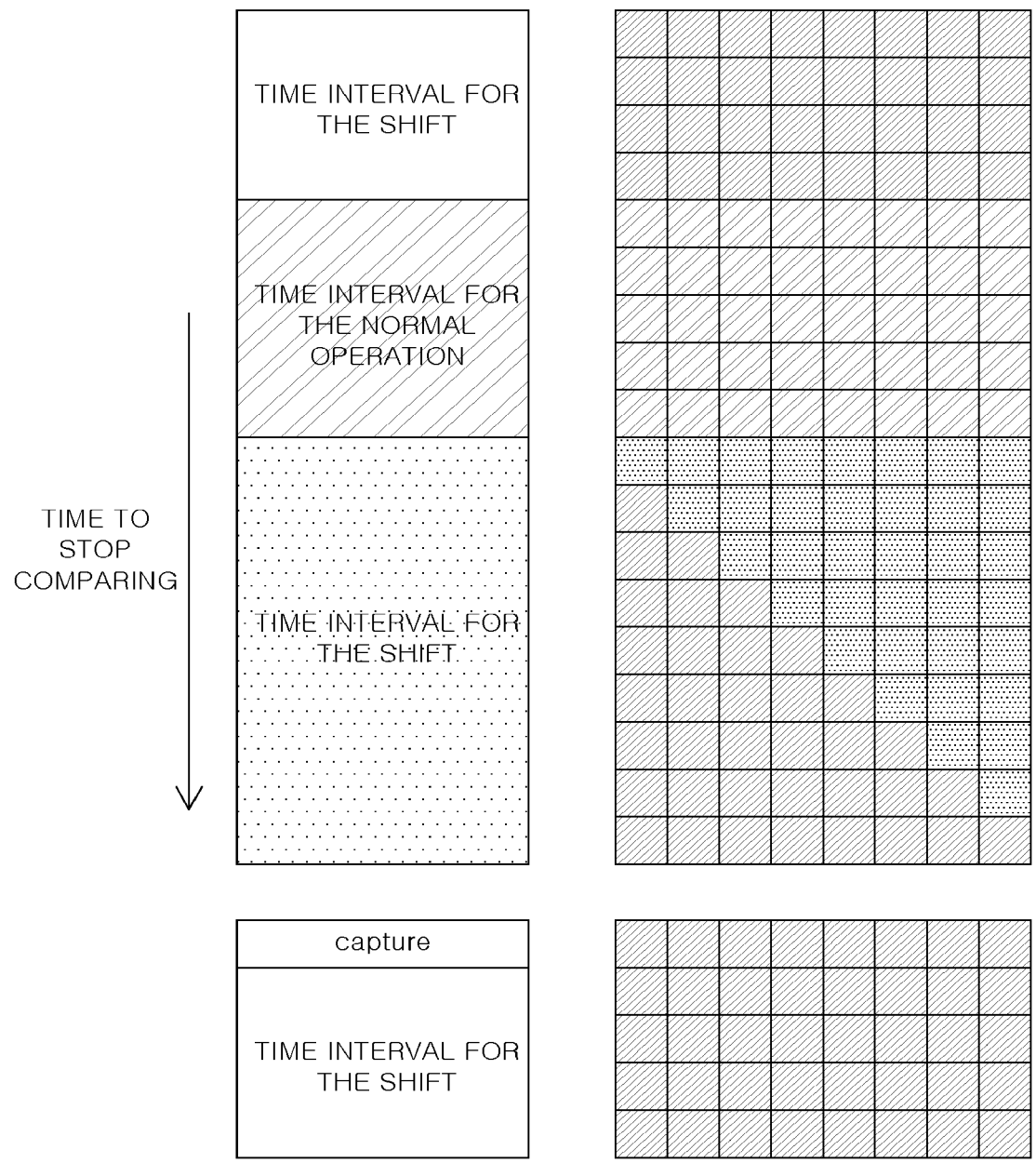
FIG. 23 is a view illustrating an example in which flip-flops operate on a scan chain.
Figure 24:
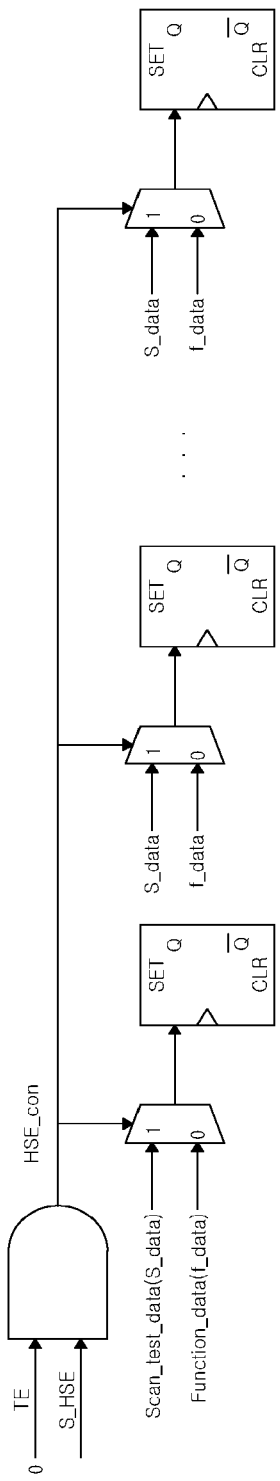
FIG. 24 is a view illustrating a part of a CUT which operates in a normal operation mode.

FIG. 23 illustrates an example in which flip-flops operate on a scan chain, and FIG. 24 illustrates a part of a CUT which operates in a normal operation mode.

When an unexpected access to the CUT from the system bus is generated, TEST_ENABLE is disabled and the data shifting or capturing may be quickly stopped. The CUT is recovered to a normal operation mode and the test may be backed off.

When the CUT enters an idle state again, a previous data shift step may start over for the test. However, in a first shifting step after shifting from the normal operation mode to the test operation mode, the comparison of the output result is deactivated and the comparison of the output results may be performed from the subsequent capturing step.

That is, as illustrated in FIG. 23, the shifted input values are not loaded in all the flip-flops at the scan chain, and the comparison may not be performed.

The function test and the test through the scan injection have advantages and disadvantages. The test through scan injection has a disadvantage in that more memories are used as compared with the function test and the time is delayed and has an advantage in that the range of the test is broad.

Specifically, when the NPU is mounted in a product which requires a high reliability like an autonomous vehicle, a drone, a UAM aircraft, or a UAV, a scan injection type test having a broad test range may be advantageous. Further, the scan injection type test may increase a frequency for a test operation and reduce the test time. When it takes a long time to test, the possibility of the car accident may be increased so that it is not desirable. The scan injection type test may increase a frequency for a test operation so that more test patterns may be injected during the idle time and the hardware defect in the NPU may be more quickly detected. The normal function test has an advantage in that the power consumption is small, but in the environment in which the high reliability is required, such as the autonomous vehicle the drone, the UAM aircraft, or the UAV, operational stability may be more important than power consumption.

The examples of the present disclosure disclosed in the present specification and the drawings merely provide a specific example for easy description and better understanding of the technical description of the present disclosure, but are not intended to limit the scope of the present disclosure. It is obvious to those skilled in the art that other modifications are possible in addition to the examples described above.

[National R&D Project Supporting this Invention]
[Task Identification Number] 1711152858
[Task Number] 2020-0-01297-003
[Name of Ministry] Ministry of Science and ICT
[Name of Project Management (Specialized) Institution] Institute of Information & Communications Technology Planning & Evaluation
[Research Project Title] Next-generation Intelligent Semiconductor Technology Development (Design)
[Research Task Title] Technology Development of a Deep Learning Processor Advanced to Reuse Data for Ultra-low Power Edge
[Contribution Rate] 1/1
[Name of Organization Performing the Task] DeepX Co., Ltd.
[Research period] 2022 Jan. 1~2022 Dec. 31

What is claimed is:

1. A neural processing unit (NPU) for testing a component during runtime, the NPU comprising:
    a plurality of functional components including
        at least one functional component which is configured to operate for an operation of an artificial neural network (ANN), and
        at least one memory which is selected as a component under test (CUT) and undergoes a test when a collision due to an access to the at least one memory is not detected.

2. The NPU of claim 1,
    wherein the plurality of functional components includes at least one of: at least one controller; and at least one processing element.

3. The NPU of claim 1,
    wherein the at least one memory includes a plurality of memory instances, the plurality of memory instances including a first group of memory instances and a second group of memory instances, and
    wherein the second group of memory instances is configured to be used when the test is performed on the first group of memory instances.

4. The NPU of claim 1, wherein the test is a first type of test or a second type of test,
    wherein the first type of test uses an error detection code, and
    wherein the second type of test is a read-write test.

5. The NPU of claim 1, further comprising a component tester configured to monitor each state of the plurality of functional components.

6. The NPU of claim 1,
    wherein the plurality of functional components include a first functional component and a second functional component,
    wherein the first functional component includes a plurality of processing elements (PEs), the plurality of PEs including a first group of PEs and a second group of PEs, and
    wherein the second group of PEs is configured to perform the operation of the artificial neural network when the test is performed on the first group of PEs.

7. A tester for detecting a defect of a neural processing unit (NPU), the tester comprising:
    a component tester configured to:
    communicate with at least one memory of the NPU, wherein the at least one memory includes a plurality of memory instances,
    select at least one memory instance as a component under test (CUT),
    prepare or start a test for the selected CUT,
    stop the test, based on a detection of a collision due to an access to the selected at least one memory instance, and
    complete the test, when no collision is detected.

8. The tester of claim 7, wherein the component tester is included in the NPU or is disposed external to the NPU.

9. The tester of claim 7, further comprising an interface configured to enable communication between the component tester and the at least one memory of the NPU.

10. The tester of claim 7, wherein the component tester is configured to perform the test on the at least one memory during runtime of the NPU.

11. The tester of claim 7, further comprising a wrapper arranged in correspondence to each of the at least one memory.

12. The tester of claim 7,
wherein the plurality of memory instances include a first group of memory instances and a second group of memory instances, and
wherein the second group of memory instances is configured to be used if when the test is performed on the first group of memory instances.

13. The tester of claim 7, wherein, when the at least one memory instance is determined as having a defect based on a result of the test, the tester is configured to:
provide information on the at least one memory instance which is determined as having the defect and information on a test input data for being inputted into the at least one memory instance during the test, or
deactivate at least one of the at least one memory instance, or isolate at least one of the at least one memory instance.

14. The tester of claim 7, wherein the test is performed with at least a portion selected from among a plurality of pre-stored test patterns.

15. A system comprising:
a neural processing unit (NPU) comprising a plurality of functional components configured to process at least one artificial neural network (ANN) model,
wherein the plurality of functional components include a plurality of memory instances; and
a component tester configured to:
select at least one memory instance as a component under test (CUT)
prepare or start a test for the selected CUT,
stop the test, based on a detection of a collision due to an access to the selected at least one memory instance, and
complete the test, when no collision is detected.

16. The system of claim 15, further comprising a plurality of wrappers respectively connected to the plurality of functional components.

17. The system of claim 15, wherein the component tester is configured to isolate the selected at least one memory instance.

18. The system of claim 15, wherein the test is a first type of test or a second type of test,
wherein the first type of test uses an error detection code, and
wherein the second type of test is a read-write test.

19. The system of claim 15, wherein the component tester is further configured to perform a scan test by at least one chain formed by connecting a plurality of flip-flops.

20. The system of claim 15, wherein the component tester is configured to generate a control signal that controls each of the plurality of functional components to operate in a normal mode or a test mode.

* * * * *